(12) United States Patent
Ishihara

(10) Patent No.: US 12,206,414 B2
(45) Date of Patent: Jan. 21, 2025

(54) ELECTRONIC CIRCUITRY

(71) Applicants: KABUSHIKI KAISHA TOSHIBA, Tokyo (JP); Toshiba Electronic Devices & Storage Corporation, Tokyo (JP)

(72) Inventor: Hiroaki Ishihara, Yokohama Kanagwa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/903,908

(22) Filed: Sep. 6, 2022

(65) Prior Publication Data
US 2023/0299753 A1  Sep. 21, 2023

(51) Int. Cl.
*H03K 3/012* (2006.01)
*H03H 11/04* (2006.01)

(52) U.S. Cl.
CPC ............. *H03K 3/012* (2013.01); *H03H 11/04* (2013.01)

(58) Field of Classification Search
CPC ...................................................... H03K 3/012
See application file for complete search history.

(56) References Cited

U.S. PATENT DOCUMENTS

| | | | |
|---|---|---|---|
| 6,456,679 B1 * | 9/2002 | Den Ouden | H04N 5/278 375/373 |
| 7,728,680 B2 | 6/2010 | Thalheim et al. | |
| 2006/0197618 A1 * | 9/2006 | Norimatsu | H04B 1/7174 331/78 |
| 2011/0238214 A1 * | 9/2011 | Yoo | G05D 1/0225 901/1 |
| 2016/0204813 A1 * | 7/2016 | Mu | H04B 1/1615 455/343.1 |
| 2017/0153648 A1 * | 6/2017 | Sjöholm | G05D 1/0265 |
| 2017/0205103 A1 * | 7/2017 | Newcomb | F02G 5/04 |
| 2018/0211165 A1 * | 7/2018 | Oh | H03K 3/017 |

* cited by examiner

*Primary Examiner* — Sibin Chen
(74) *Attorney, Agent, or Firm* — Foley & Lardner LLP

(57) ABSTRACT

According to one embodiment, electronic circuitry includes a transmission circuit to output a waveform including a plurality of pulse waveforms in response to an input signal. The pulse waveforms include a first transmit pulse waveform, and a second transmit pulse waveform following the first transmit pulse waveform, and the first transmit pulse waveform is larger in amplitude than the second transmit pulse waveform.

19 Claims, 31 Drawing Sheets

ELECTRONIC CIRCUITRY

CROSS REFERENCE TO RELATED APPLICATIONS

This application is based upon and claims the benefit of priority from the prior Japanese Patent Application No. 2022-041114, filed on Mar. 16, 2022, the entire contents of which are incorporated herein by reference.

FIELD

The present embodiment relates to electronic circuitry.

BACKGROUND

There is an insulated signal transmission method for transmitting an input signal from a transmitter to a receiver via an insulation element. In insulated signal transmission, there are methods for transmitting digital signals using High or Low pulses.

Because insulation elements generally have band-pass filter type frequency characteristics, an output waveform outputted from the transmitter to the receiver via the insulation element is an analog waveform including a pulse waveform from which components other than a specific frequency component have been removed.

The receiver reproduces information from the received analog waveform by determining whether a digital signal included in a transmit signal is High or Low.

In other words, in order to receive the signal included in the input signal, pulses are reproduced based on the outputted analog waveform, which makes it necessary to determine High and Low signals included in the pulses.

However, because the analog waveform is affected by noise and the like, some pulses may not allow determination as to whether the pulses are High or Low.

In such a case, the pulses will limit reception performance by acting as a bottleneck.

To improve input signal reception performance, it is necessary to increase pulse amplitude and pulse width of the pulses. In other words, there is a task of increasing transmission energy, which is energy of a signal transmitted by the transmitter.

DETAILED DESCRIPTION

According to one embodiment, electronic circuitry includes a transmission circuit to output a waveform including a plurality of pulse waveforms in response to an input signal. The pulse waveforms include a first transmit pulse waveform, and a second transmit pulse waveform following the first transmit pulse waveform, and the first transmit pulse waveform is larger in amplitude than the second transmit pulse waveform.

An embodiment of the present invention will be described below with reference to the accompanying drawings.

Figure 1:
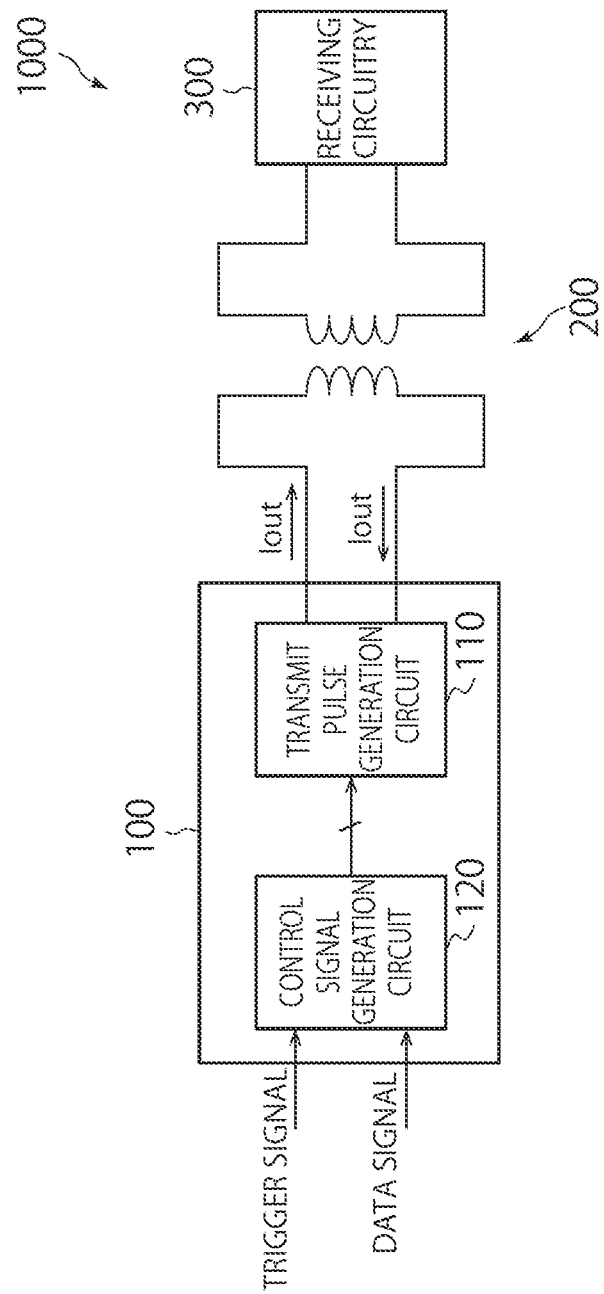
FIG. 1 is a diagram showing an overall configuration of transmitting-receiving circuitry according to the present embodiment.
Figure 2:
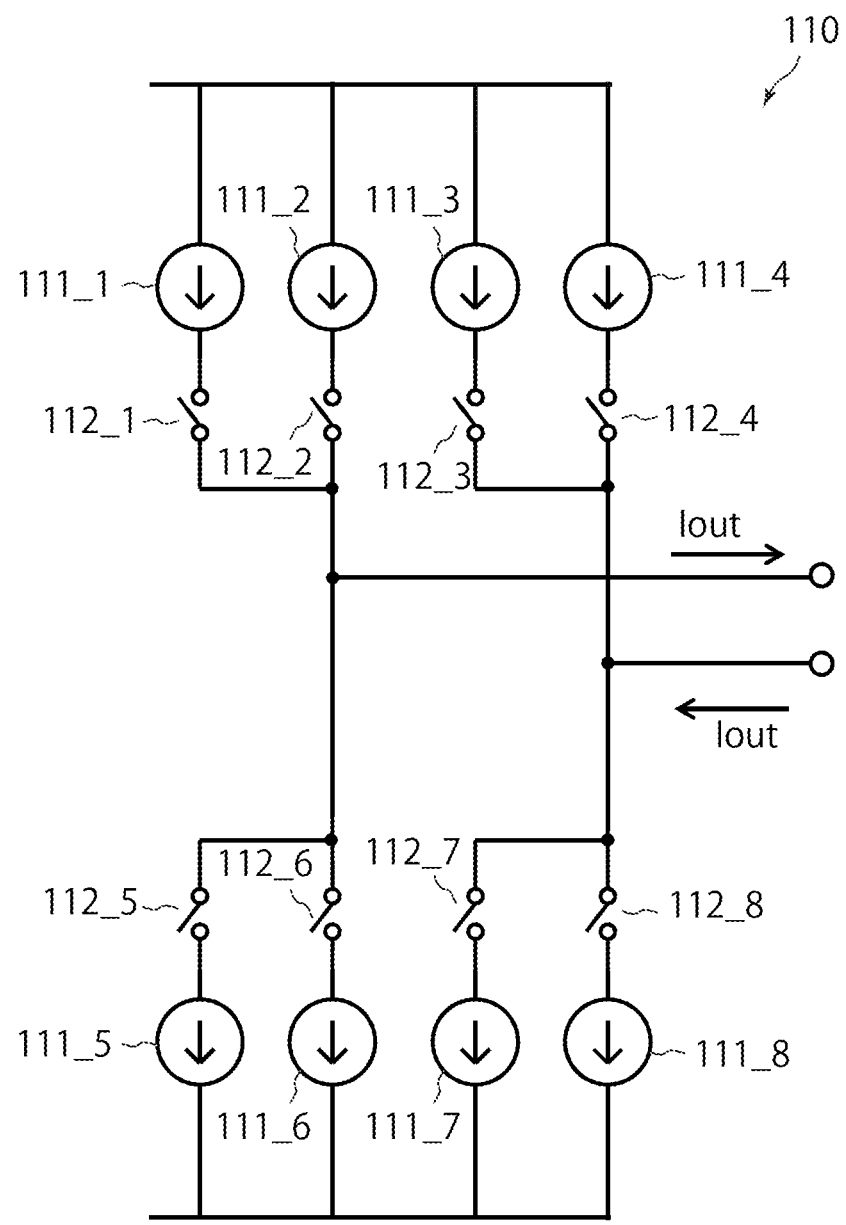
FIG. 2 is a diagram showing a circuit configuration of a transmit pulse generation apparatus.
Figure 3:
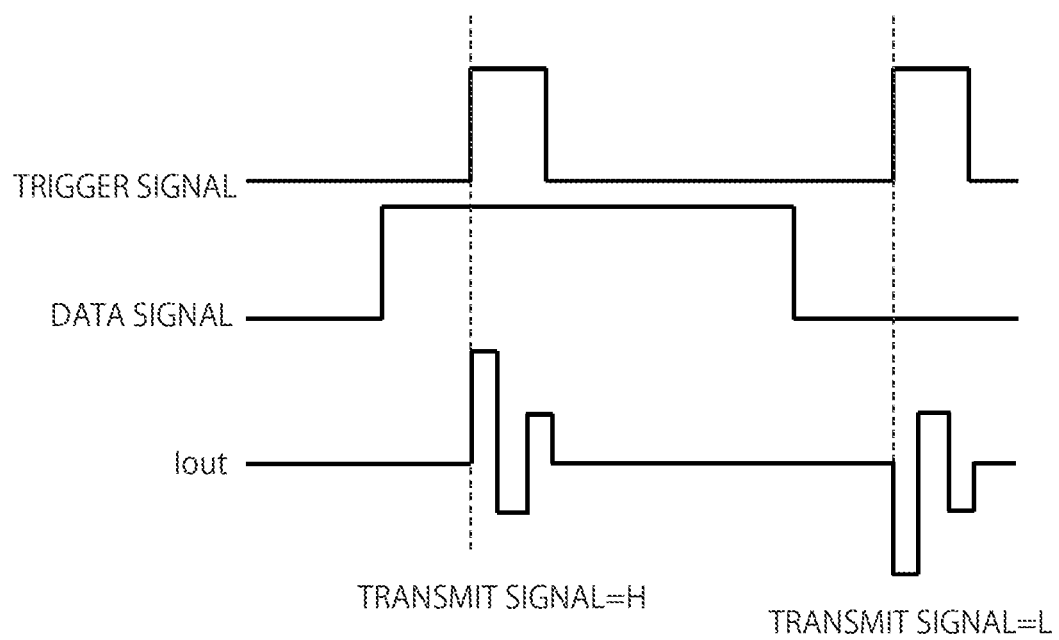
FIG. 3 is a diagram showing a transmit signal outputted in combination with a trigger signal and a data signal.
Figure 4:
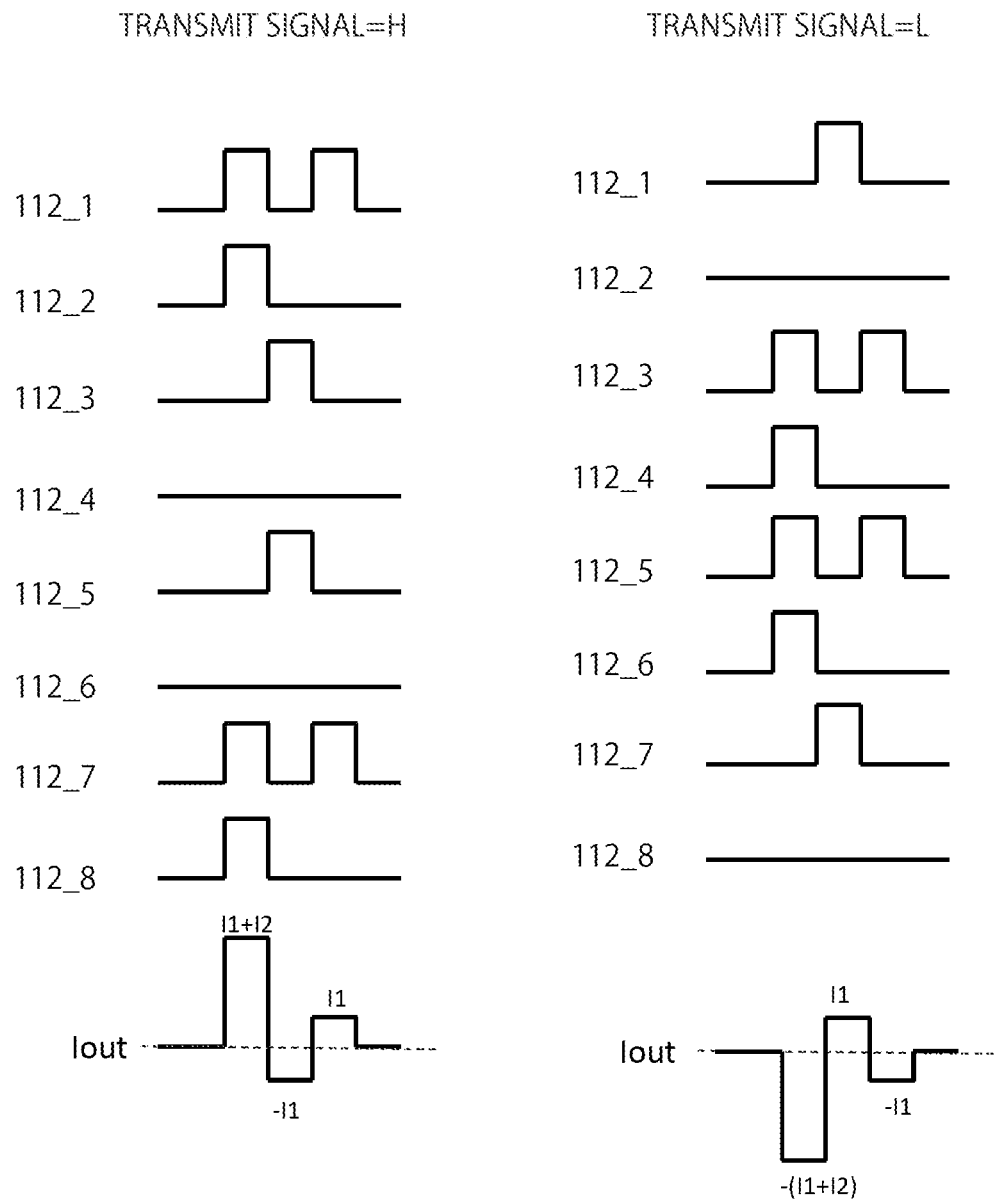
FIG. 4 is a diagram showing activation and deactivation of switches during signal transmission.

FIG. 1 shows an overall configuration of transmitting-receiving circuitry 1000 according to the present embodiment. FIG. 2 shows a circuit configuration of a transmit pulse generation circuit (a transmit pulse generator) 110. FIG. 3 shows a transmit signal outputted in combination with a trigger signal and a data signal. FIG. 4 shows activation and deactivation of switches during signal transmission.

The transmitting-receiving circuitry 1000 (electronic circuitry) includes transmitting circuitry 100, an insulation element 200, and receiving circuitry 300.

The transmitting-receiving circuitry 1000 transmits signals, with the transmitting circuitry 100 (electronic circuitry) on an input side and the receiving circuitry 300 on an output side being insulated by the insulation element 200, which is an electrical insulator.

The transmitting circuitry 100 outputs an analog waveform (first waveform) based on an input signal. Specifically, the transmitting circuitry 100 outputs the analog waveform (first waveform) in synchronization with transition of the input signal. The transmitting circuitry 100 may also be called a transmission circuit or a transmitter.

The input signal is produced, for example, by converting an analog signal outputted from a current sensor or a voltage sensor into a digital signal.

The input signal includes signals such as noise, other than an electrical signal observed by the current sensor or the voltage sensor and to be amplified.

The transition of the input signal indicates changes in the state of the input signal. The transition of the input signal includes, for example, a rising edge and falling edge of the input signal.

The transmitting circuitry 100 includes the transmit pulse generation circuit 110 and a control signal generation circuit (a control signal generator) 120.

The analog waveform outputted from the transmitting circuitry 100 is a waveform including successive pulse waveforms.

The successive pulse waveforms include not only pulse waveforms spaced without any interval, but also pulse waveforms spaced at regular intervals. The successive pulse waveforms include, for example, pulse waveforms spaced at one-second intervals.

For example, if the number of pulse waveforms is N (N is a natural number larger than 1), the transmitting circuitry 100 transmits an input signal as an analog waveform made up of N successive pulse waveforms.

The pulse waveforms can represent Boolean values if it is determined whether the pulse waveforms are High or Low based on amplitude.

For example, the analog waveform can be regarded as a digital signal represented by N bits.

In the following description, it is assumed that the number N of pulse waveforms included in the analog waveform is three.

The transmitting circuitry 100 transmits the input signal by converting the input signal into an analog waveform made up of three pulse waveforms.

In the present description, the first of the three pulses outputted by the transmitting circuitry 100 will be designated as a first transmit pulse (first transmit pulse waveform), the pulse outputted next will be designated as a second transmit pulse (second transmit pulse waveform), and the pulse outputted next will be designated as a third transmit pulse (third transmit pulse waveform).

The transmit pulse generation circuit 110 generates pulse waveforms. According to the present embodiment, the transmit pulse generation circuit 110 generates pulse waveforms using differential current pulses.

The transmit pulse generation circuit 110 includes current sources 111_1 to 111_8 and switches 112_1 to 112_8.

The current sources 111_1, 111_3, 111_5, and 111_7 (first current sources) pass a current of I1. Similarly, the current sources 111_2, 111_4, 111_6, and 111_8 (second current sources) pass a current of I2.

The switches 112_1, 112_3, 112_5, and 112_7 (first switches) are connected to the current sources 111_1, 111_3, 111_5, and 111_7.

Similarly, the switches 112_2, 112_4, 112_6, and 112_8 (second switches) are connected to the current sources 111_2, 111_4, 111_6, and 111_8.

The switches 112_1 to 112_8 control outputs of the current sources by opening and closing. For example, when any of the switches turns ON, a current flows through the circuit from the corresponding current source.

In output control of the current sources, the opening and closing of the switches 112_1 to 112_8 are not limited to opening and closing of mechanical contacts.

The switches 112_1 to 112_8 may perform output control of the current sources using logic gates. For example, the switches 112_1 to 112_8 may be digital circuits such as transistors or integrated circuits (ICs).

By combining transmit pulses differing in polarity, the transmit pulse generation circuit 110 transmits two types of signals—an H signal and an L signal—as transmit signals.

The H signal, for example, indicates that a digital signal is High and the L signal, for example, indicates that a digital signal is Low.

For example, to transmit an H signal, in the first transmit pulse, the switches 112_1, 112_2, 112_7, and 112_8 (first switches) are turned ON simultaneously, thereby outputting a current of I1+I2 to Iout.

Next, in the second transmit pulse, the switches 112_3 and 112_5 are turned ON simultaneously, thereby outputting a current of −I1 to Iout.

Finally, in the third transmit pulse, the switches 112_1 and 112_7 are turned ON simultaneously, thereby outputting a current of I1 to Iout.

In other words, to transmit an H signal, as shown in FIG. 4, the switch 112_1 is set to ON, OFF, and ON in order.

Similarly, the switch 112_2 is set to ON, OFF, and OFF in order. The switch 112_3 is set to OFF, ON, and OFF in order. The switch 112_4 is set to OFF, OFF, and OFF in order. The switch 112_5 is set to OFF, ON, and OFF in order. The switch 112_6 is set to OFF, OFF, and OFF in order. The switch 112_7 is set to ON, OFF, and ON in order. The switch 112_8 is set to ON, OFF, and OFF in order.

The currents flowing through Iout are outputted in the order: I1+I2, −I1, and I1.

The first transmit pulse, the second transmit pulse, and the third transmit pulse are outputted in proportion to the magnitude of the current output. In other words, the first transmit pulse, which is outputted based on a current larger by I2, becomes larger than the third transmit pulse.

By adjusting the currents passed by current sources, it is possible to adjust the current amplitudes of transmit pulses.

For example, if the currents passed by current sources are adjusted to satisfy a relationship of I2=2×I1, the current amplitude of the first transmit pulse can be set three times larger than the other pulses. Besides, by adjusting the currents passed by current sources, it is possible to set the ratio between the amplitudes of the first transmit pulse and another transmit pulse to any desired value.

For example, to transmit an L signal, in the first transmit pulse, the switches 112_3, 112_4, 112_5, and 112_6 are turned ON simultaneously, thereby outputting a current of −(I1+I2) to Iout.

Next, in the second transmit pulse, the switches 112_1 and 112_7 are turned ON simultaneously, thereby outputting a current of I1 to Iout.

Finally, in the third transmit pulse, the switches 112_3 and 112_5 are turned ON simultaneously, thereby outputting a current of −I1 to Iout.

In other words, to transmit an L signal, as shown in FIG. 4, the switch 112_1 is set to OFF, ON, and OFF in order.

Similarly, the switch 112_2 is set to OFF, OFF, and OFF in order. The switch 112_3 is set to ON, OFF, and ON in order. The switch 112_4 is set to ON, OFF, and OFF in order. The switch 112_5 is set to ON, OFF, and ON in order. The switch 112_6 is set to ON, OFF, and OFF in order. The switch 112_7 is set to OFF, ON, and OFF in order. The switch 112_8 is set to OFF, OFF, and OFF in order.

The currents flowing through Iout are outputted in the order: −(I1+I2), I1, and −I1.

The first transmit pulse, the second transmit pulse, and the third transmit pulse are outputted in proportion to the magnitude of the current output. In other words, the first transmit pulse, which is outputted based on a current larger by I2, becomes larger than the third transmit pulse.

The control signal generation circuit 120 generates control signals for use to control operation of the switches included in the transmit pulse generation circuit 110.

The control signal generation circuit 120 controls switch operation of the transmit pulse generation circuit 110 using two types of signals: a data signal and a trigger signal.

The trigger signal indicates timing for the transmit pulse generation circuit 110 to transmit a pulse. The trigger signal allows determination as to whether the trigger signal is High or Low.

The control signal generation circuit 120 transmits a pulse signal on a rising edge of the trigger signal.

The data signal indicates the type of signal outputted by a transmit pulse. As with the trigger signal, the data signal allows determination as to whether the data signal is High or Low.

The control signal generation circuit 120 controls the switches included in the transmit pulse generation circuit 110 such that transmit pulses will be outputted according to whether the data signal is High or Low.

According to the present embodiment, the control signal generation circuit 120 transmits an H signal when the data signal is High. When the data signal is Low, the control signal generation circuit 120 transmit an L signal.

For example, as shown in FIG. 3, at a time when a rising edge of a trigger signal is detected and the data signal is shown to be High, the transmit pulse generation circuit 110 transmits an H signal.

For example, at a time when a rising edge of a trigger signal is detected and the data signal is shown to be Low, the transmit pulse generation circuit 110 transmits an L signal.

The trigger signal and the data signal may be combined, forming an input signal that causes an analog waveform (first waveform) to be outputted.

The transmit pulse generation circuit 110 and the control signal generation circuit 120 are integrally incorporated in the transmitting circuitry 100 according to the present embodiment, but may be provided separately.

For example, the transmitting circuitry 100 may output an analog waveform and one or both of the transmit pulse generation circuit 110 and the control signal generation circuit 120 may be provided outside the transmitting circuitry 100.

Figure 5:
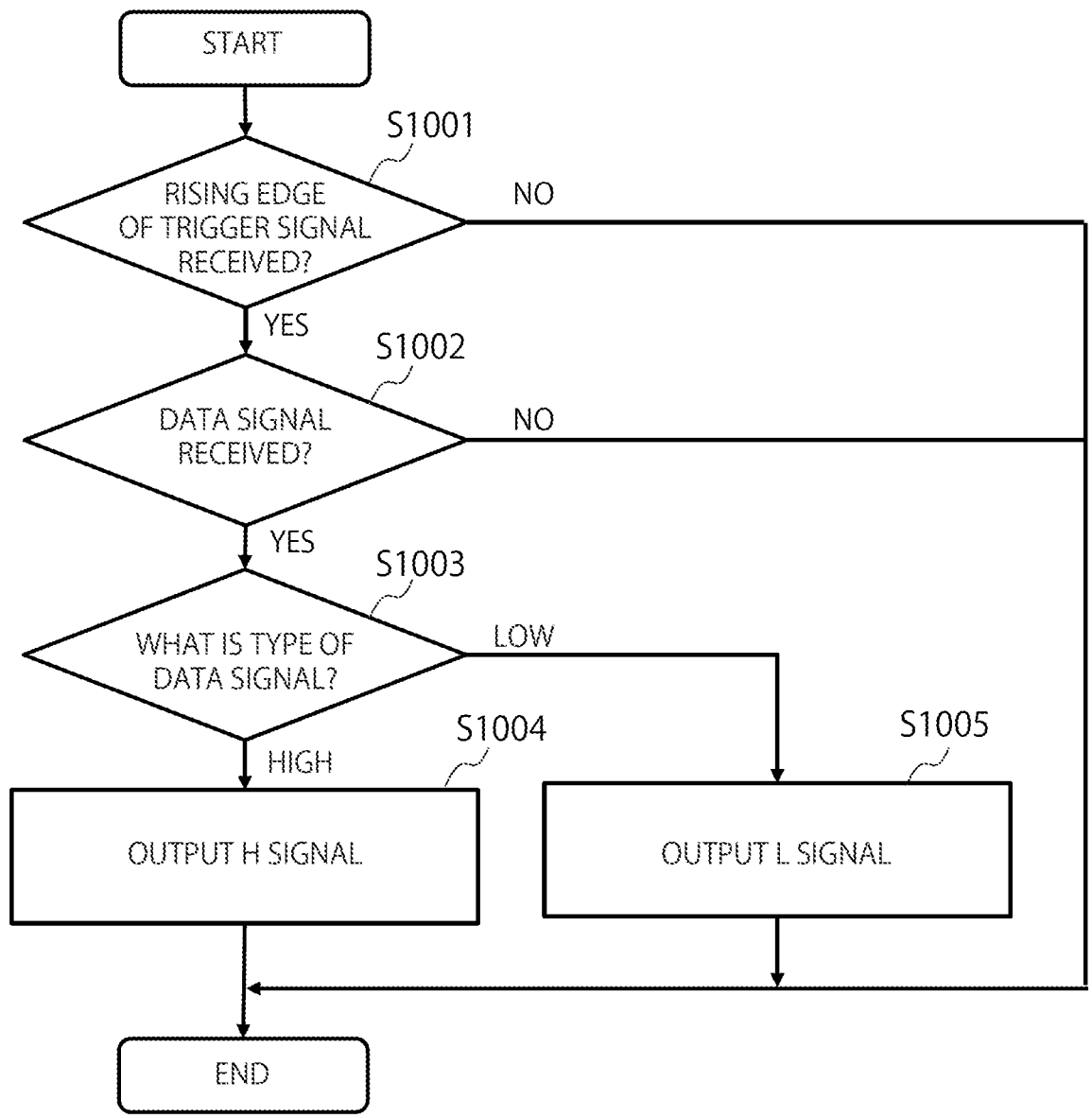
FIG. 5 is a flowchart showing an example of an operation whereby transmitting circuitry transmits an analog waveform.

FIG. 5 shows an example of an operation whereby the transmitting circuitry 100 transmits an analog waveform.

The control signal generation circuit 120 determines whether a rising edge of a trigger signal has been received (S1001). If a rising edge of a trigger signal has been received, the control signal generation circuit 120 goes to S1002, but otherwise finishes the process.

The control signal generation circuit 120 determines whether a data signal has been received (S1002). If a data signal has been received, the control signal generation circuit 120 goes to S1003, but otherwise finishes the process.

The control signal generation circuit 120 determines the type of the received data signal (S1003). If a High data signal has been received, the control signal generation circuit 120 goes to S1004, but if a Low data signal has been received, the control signal generation circuit 120 goes to S1005.

If the received data signal is High, the control signal generation circuit 120 controls the transmit pulse generation circuit 110 so as to output an H signal (S1004).

Similarly, if the received data signal is Low, the control signal generation circuit 120 controls the transmit pulse generation circuit 110 so as to output an L signal (S1005).

Figure 6:
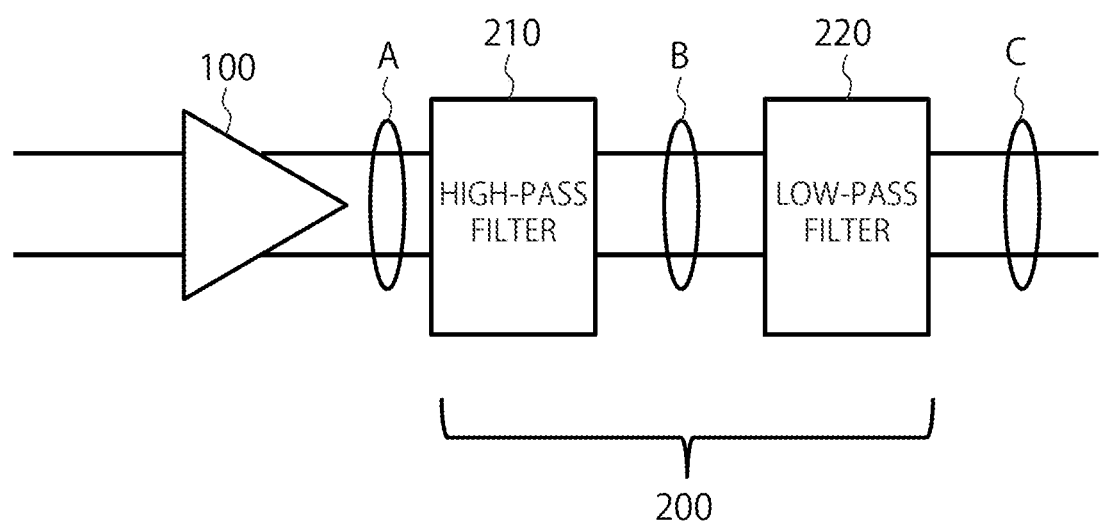
FIG. 6 is a diagram showing a structure of an insulation element.

FIG. 6 is a diagram showing a structure of an insulation element 200.

Using electromagnetic coupling, the insulation element 200 transfers the analog waveform transmitted from the transmitting circuitry 100. The insulation element 200 may also be called a transfer circuit. In so doing, the insulation element 200 extracts specific frequency bands from a signal transmitted from the transmitting circuitry 100 (has bandpass characteristics). In other words, the insulation element 200 functions as a filter that extracts specific frequency bands (that has bandpass characteristics). The filter may also be called a filtration device. As a result, the analog waveform transmitted from the transmitting circuitry 100 is deformed by being transferred through the insulation element 200.

From the input signal, the insulation element 200 removes signals such as noise other than an electrical signal to be transferred.

The insulation element 200 includes a high-pass filter 210 and a low-pass filter 220.

The high-pass filter 210 gradually reduces frequency components lower than a cut-off frequency without attenuating frequency components higher than the cut-off frequency.

The low-pass filter 220 gradually reduces frequency components higher than a cut-off frequency without attenuating frequency components lower than the cut-off frequency.

When combined with each other, the high-pass filter 210 and the low-pass filter 220 functions as a band-pass filter that extracts a component of a specific frequency band.

Using the high-pass filter 210 and the low-pass filter 220, the insulation element 200 extracts a component of a specific frequency band from the analog waveform outputted by the transmitting circuitry 100.

Examples include a case in which cut-off frequency on a low frequency side is larger than one tenth the inverse of the pulse width of the transmit pulse.

As a result of the extraction, the insulation element 200 outputs a receive signal (second waveform), which is an analog waveform whose pulse edges are enhanced, from the analog waveform of the transmit signal.

The receive signal includes receive pulses corresponding to transmit pulses included in the transmit signal. For example, the receive signal includes a first receive pulse (first receive pulse waveform) corresponding to the first transmit pulse.

Note that according to the present embodiment, the insulation element 200 is made up of an isolation transformer to function as a band-pass filter, but may be made up of other elements. For example, the insulation element 200 may be made up of an element such as a condenser or a capacitor.

The insulation element 200 may be connected to the receiving circuitry 300 via an antenna.

The receiving circuitry 300 receives analog waveforms. The receiving circuitry 300 may also be called a receiver circuit or a receiver.

The analog waveform received by the receiving circuitry 300 is a transmit signal from which noise and the like have been removed by the insulation element 200.

From the receive pulses included in the received analog waveform, the receiving circuitry 300 determines whether digital signals are High or Low, and thereby reproduces the input signal.

Figure 7:
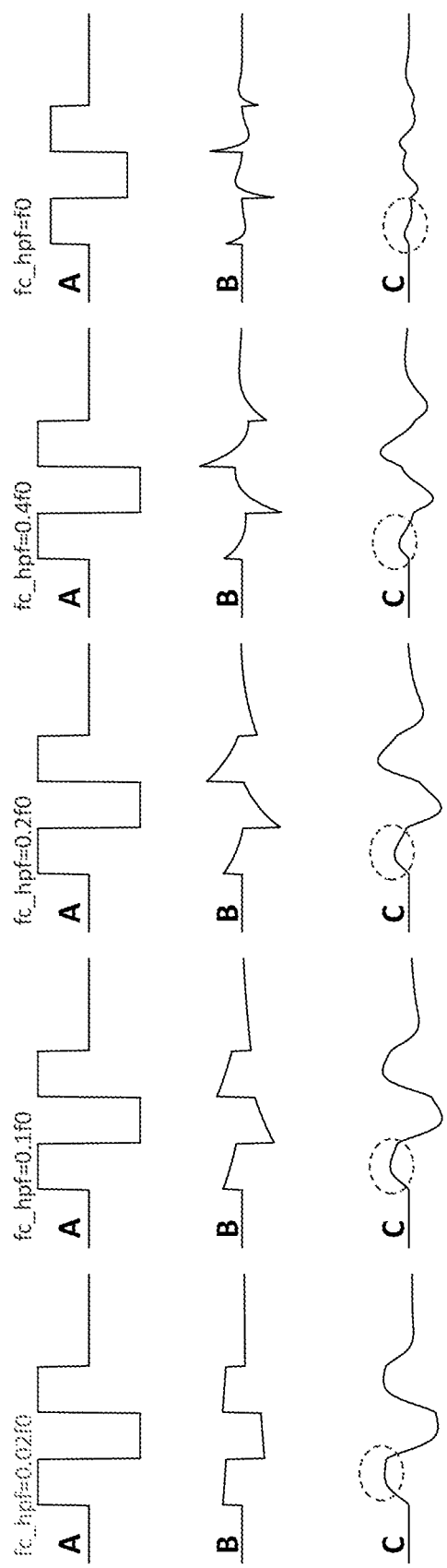
FIG. 7 is a diagram showing changes in pulses taking place on specific terminals when cut-off frequency of a high-pass filter is changed.
Figure 8:
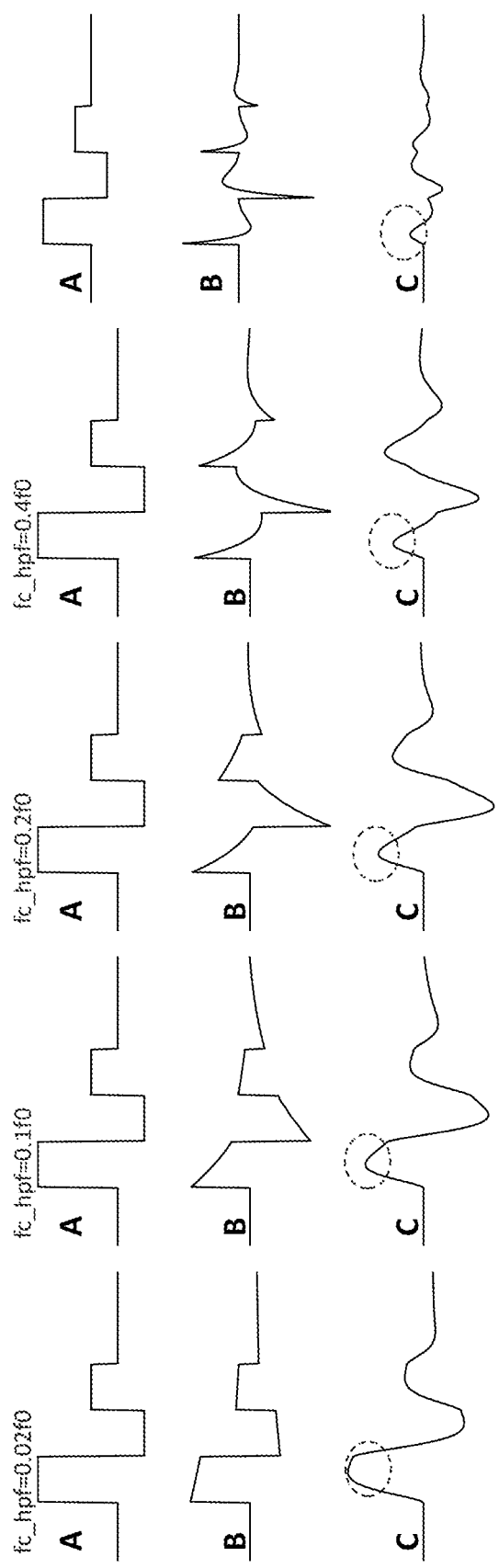
FIG. 8 is a diagram showing changes in pulses taking place when the pulses are transmitted by amplifying amplitude of a first transmit pulse in FIG. 6.
Figure 9:
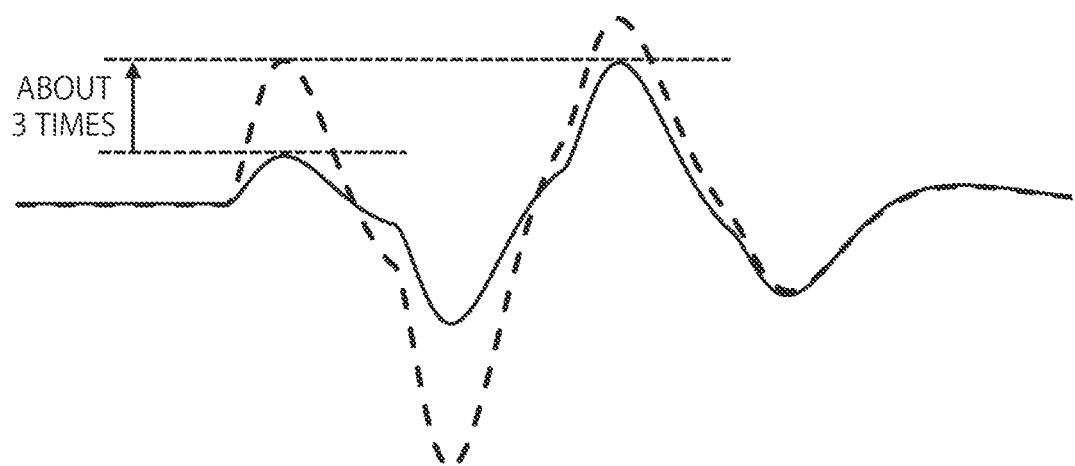
FIG. 9 is a diagram showing changes in pulses taking place when cut-off frequency of a high-pass filter is changed to a specific frequency.

FIG. 7 shows changes in pulses taking place on specific terminals when cut-off frequency of the high-pass filter 210 is changed. FIG. 8 shows changes in pulses taking place when the pulses are transmitted by amplifying the amplitude of the first transmit pulse in FIG. 6. FIG. 9 shows changes in pulses taking place when the cut-off frequency of the high-pass filter 210 is changed to a specific frequency.

On the transmitting-receiving circuitry 1000 an analog waveform transmitted by the transmitting circuitry 100 is passed through the high-pass filter 210 and then through the low-pass filter 220, and subsequently received by the receiving circuitry 300.

If tpulse designates pulse width and a fundamental frequency is given as $f0=1/tpulse$, when the cut-off frequency ($fc\_hpf$) of the high-pass filter 210 is changed in a range of $0.02f0$ to $f0$ on terminals A, B, and C in FIG. 6, resulting waveforms are shown as in FIGS. 7 and 8.

FIG. 7 shows a case in which pulse waveforms included in the analog waveform are equal in magnitude, and FIG. 8 shows a case in which, of the pulse waveforms included in the analog waveform, the pulse waveform of the first transmit pulse is larger than other transmit pulses.

The waveform measured on terminal A in FIG. 6 is an analog waveform immediately after transmission from the transmitting circuitry 100, i.e., a waveform resulting from measurement of the transmit pulse. The waveform measured on terminal B in FIG. 6 is an analog waveform immediately after passage through the high-pass filter 210. The waveform measured on terminal C in FIG. 6 is an analog waveform immediately after passage through the low-pass filter 220, i.e., a waveform resulting from measurement of the receive pulse.

If appropriate cut-off frequencies are selected for the high-pass filter 210 and low-pass filter 220 included in the insulation element 200, an outline of the receive pulse measured on terminal C is reproduced.

Of the analog waveform measured on terminal B, a signal corresponding to a rising edge of the first transmit pulse is smaller than signals corresponding to edges of the second transmit pulse and the third transmit pulse.

Similarly, of the analog waveform measured on terminal C, a signal corresponding to a rising edge of the first transmit pulse of the analog waveform measured on terminal B is smaller than signals corresponding to edges of the second transmit pulse and the third transmit pulse.

When all the pulse waveforms included in the analog waveform are equal in magnitude, as shown in FIG. 7, of the analog waveform measured on terminal C, a signal corresponding to a rising edge of the first transmit pulse is smaller than signals corresponding to edges of the second transmit pulse and the third transmit pulse.

On the other hand, if of the pulse waveforms included in the analog waveform, the pulse waveform of the first transmit pulse is larger than other transmit pulses, as shown in FIG. 8, of the analog waveform measured on terminal C, a signal corresponding to a rising edge of the first transmit pulse is nearly equal in magnitude to signals corresponding to edges of the second transmit pulse and the third transmit pulse.

A tendency of the signal corresponding to the rising edge of the first transmit pulse becomes more pronounced with increases in $fc\_hpf$. For example, around $fc\_hpf>0.1f0$, the signal corresponding to the rising edge of the first transmit pulse becomes particularly smaller than the signals corresponding to edges of the second transmit pulse and the third transmit pulse.

Furthermore, of the receive pulses included in the analog waveform measured on terminal C, an output waveform corresponding to the first receive pulse has a small amplitude.

The transmitting-receiving circuitry 1000 uses the receiving circuitry 300 to receive the receive pulses included in the analog waveform measured on terminal C.

If the receive pulses are reproduced by a comparator or the like, the transmit pulses can be restored and thereby the input signal can be received.

In other words, as long as it can be determined whether the first receive pulse of the analog waveform measured on terminal C is High or Low, it is possible to determine whether a second receive pulse (second receive pulse waveform) and a third receive pulse are High or Low, and the transmit pulses can be restored from the receive pulses on the receiving circuitry 300.

In other words, reception performance of the transmitting-receiving circuitry 1000 is determined based on the first receive pulse, which has the smallest amplitude among the receive pulses corresponding to the transmit pulses.

Of the analog waveform on terminal C, signal energy is proportional to the magnitude of amplitude.

When noise and the like in the signal is considered, the receiving circuitry 300 has its reception performance restricted by the pulse whose signal energy is the lowest, i.e., by the first receive pulse.

By increasing the signal energy acting on the entire analog waveform measured on terminal C, i.e., by increasing the energy of the signal transmitted by the transmitting circuitry 100, it is possible to increase the amplitude of the first receive pulse and improve the reception performance of the receiving circuitry 300.

The power consumed by the transmitting circuitry 100 is generally proportional to pulse height or to the square of the pulse height.

In the description given herein, it is assumed that the power consumption is proportional to pulse amplitude.

When the energy of the signals transmitted by the transmitting circuitry 100 increases, the power consumption increases proportionately.

The transmitting-receiving circuitry 1000 according to the present embodiment increases the amplitude of the first transmit pulse using the transmitting circuitry 100. This makes it possible to increase the amplitude of the analog waveform corresponding to the first receive pulse and measured on terminal C.

For example, as indicated by a solid line in FIG. 9, when fc_hpf=0.4f0, the amplitude of the first transmit pulse on terminal C is approximately 0.4 times the amplitudes of the other pulses.

Here, as indicated by a broken line in FIG. 9, if the amplitude of the first transmit pulse is tripled, the amplitude of the first receive pulse at fc_hpf=0.4f0 becomes approximately 0.8 times the amplitude of the third receive pulse and the amplitude of the receive pulse corresponding to the transmit pulse increases.

In other words, when the first transmit pulse is tripled, the amplitude corresponding to the first receive pulse on which the reception performance depends improves nearly three-fold.

When the first transmit pulse is simply tripled, the amplitude of the first receive pulse received by the receiving circuitry 300 is tripled as well, solving a bottleneck of the reception performance.

Figure 10:
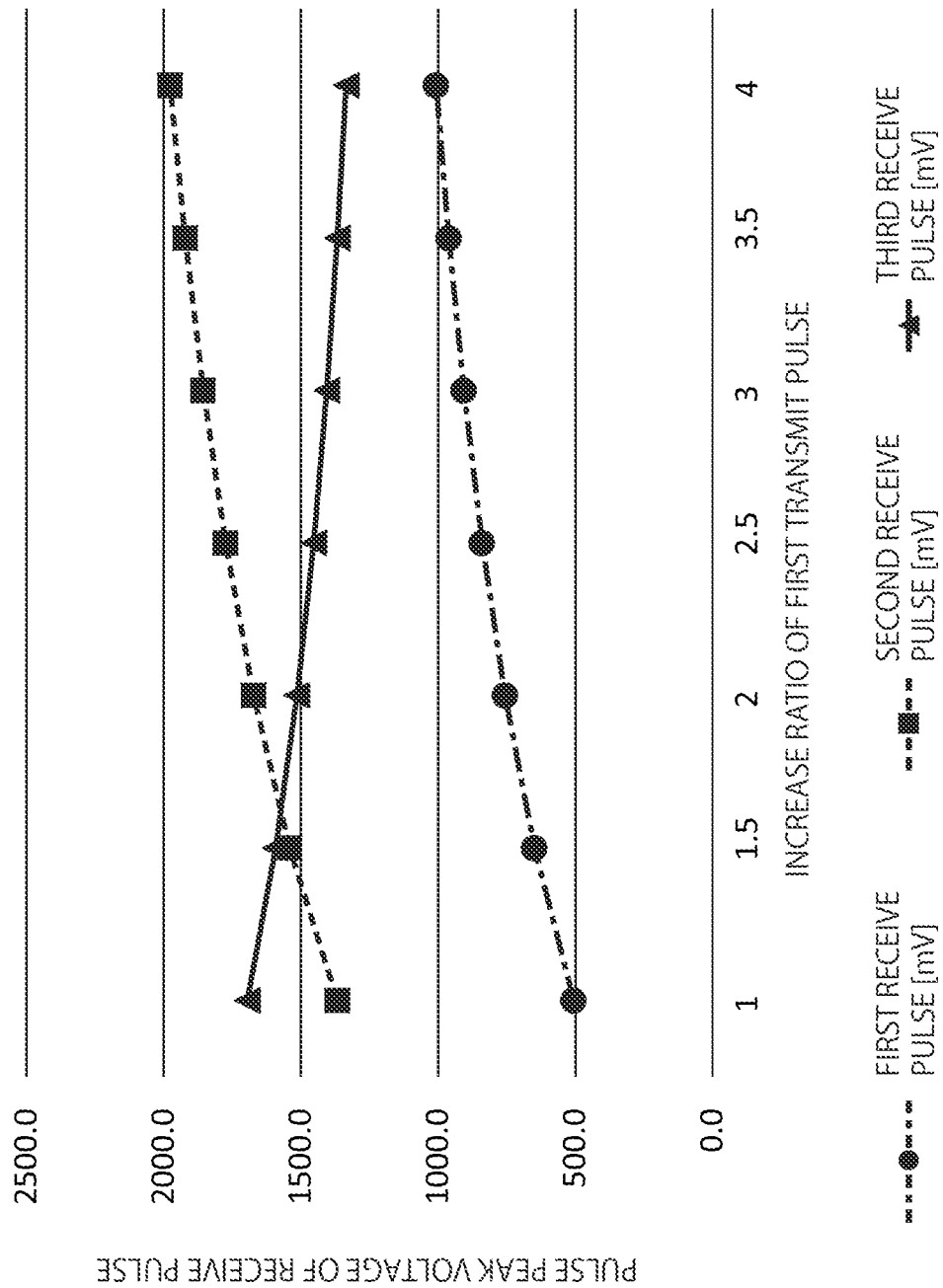
FIG. 10 is a diagram showing relationships among current pulses compared by keeping overall current consumption constant.

FIG. 10 shows relationships among current pulses compared by keeping overall current consumption constant.

In FIG. 10, the abscissa represents the increase ratio of the first transmit pulse and the ordinate represents the pulse peak voltage of the receive pulse. In FIG. 10, the dashed line represents the first receive pulse, the chain line represents the second receive pulse, and the solid line represents the third receive pulse.

For example, when the first transmit pulse is simply tripled, the power consumption of the transmitting circuitry 100 increases to 5/3 times.

In so doing, the power consumption of the transmitting-receiving circuitry 1000 is reduced compared to when all the first to third transmit pulses are tripled.

As described above, the reception performance of the transmitting-receiving circuitry 1000 is determined based on the magnitude of the receive pulse that becomes the smallest.

In other words, according to the present embodiment, the reception performance of the transmitting-receiving circuitry 1000 is determined based on the magnitude of the first receive pulse, which is the smallest.

For example, when the power consumption of the transmitting circuitry 100 is kept constant, with increases in the first transmit pulse, the other transmit pulses are reduced.

For example, as shown in FIG. 10, even if the first transmit pulse is amplified three times, the receive pulse that becomes the smallest is the first receive pulse as seen from the magnitude of the pulse peak voltage.

In other words, without increasing consumed power, the transmitting-receiving circuitry 1000 allows its reception performance to be improved through amplification of the first receive pulse that becomes the smallest.

Figure 11:
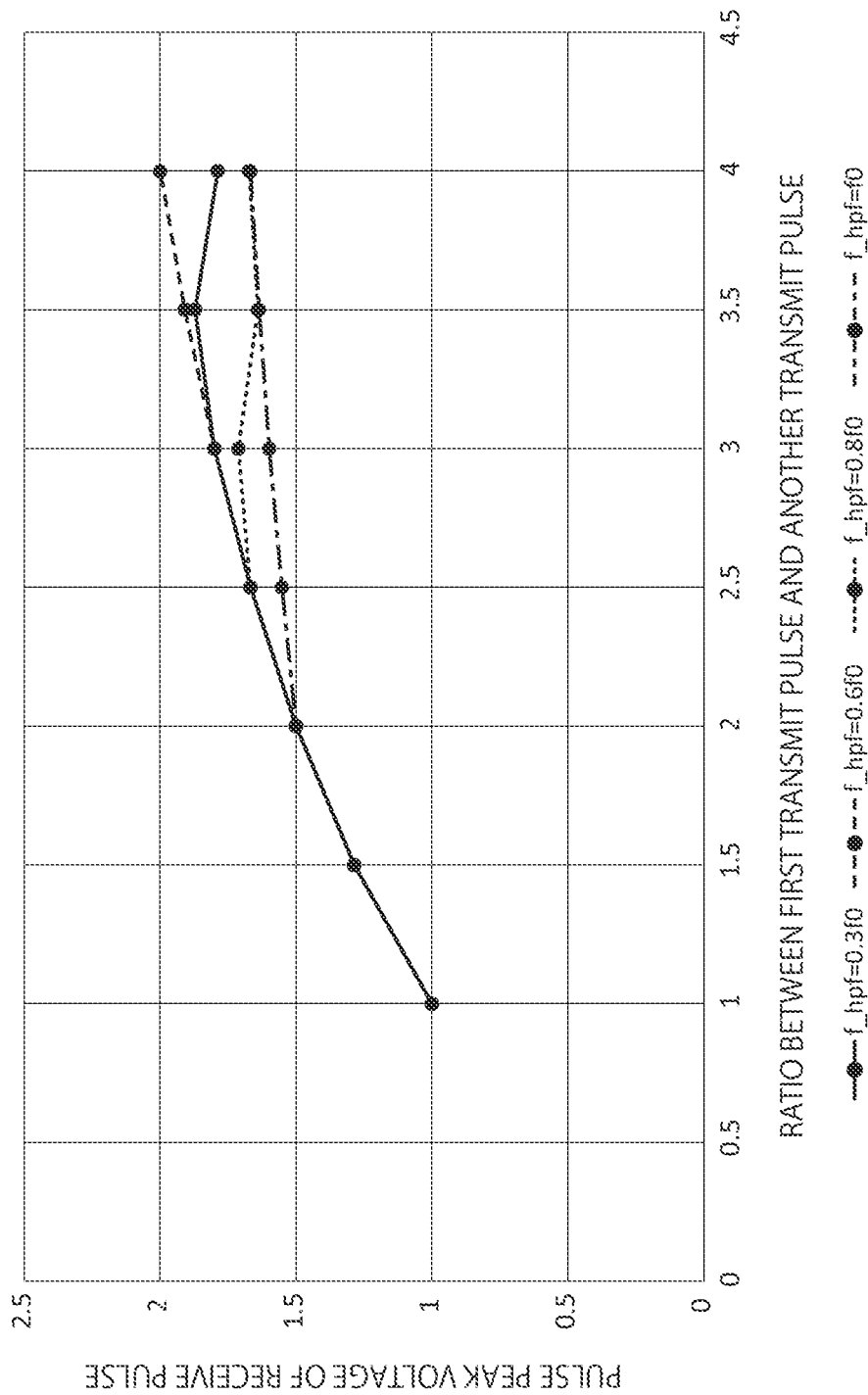
FIG. 11 is a diagram showing a ratio of a first receive pulse to a ratio between a first transmit pulse and another transmit pulse based on a condition under which power consumption is constant when the power consumption is proportional to pulse amplitude.

FIG. 11 shows a ratio of a first receive pulse to a ratio between a first transmit pulse and another transmit pulse based on a condition under which power consumption is constant when the power consumption is proportional to pulse amplitude.

Figure 12:
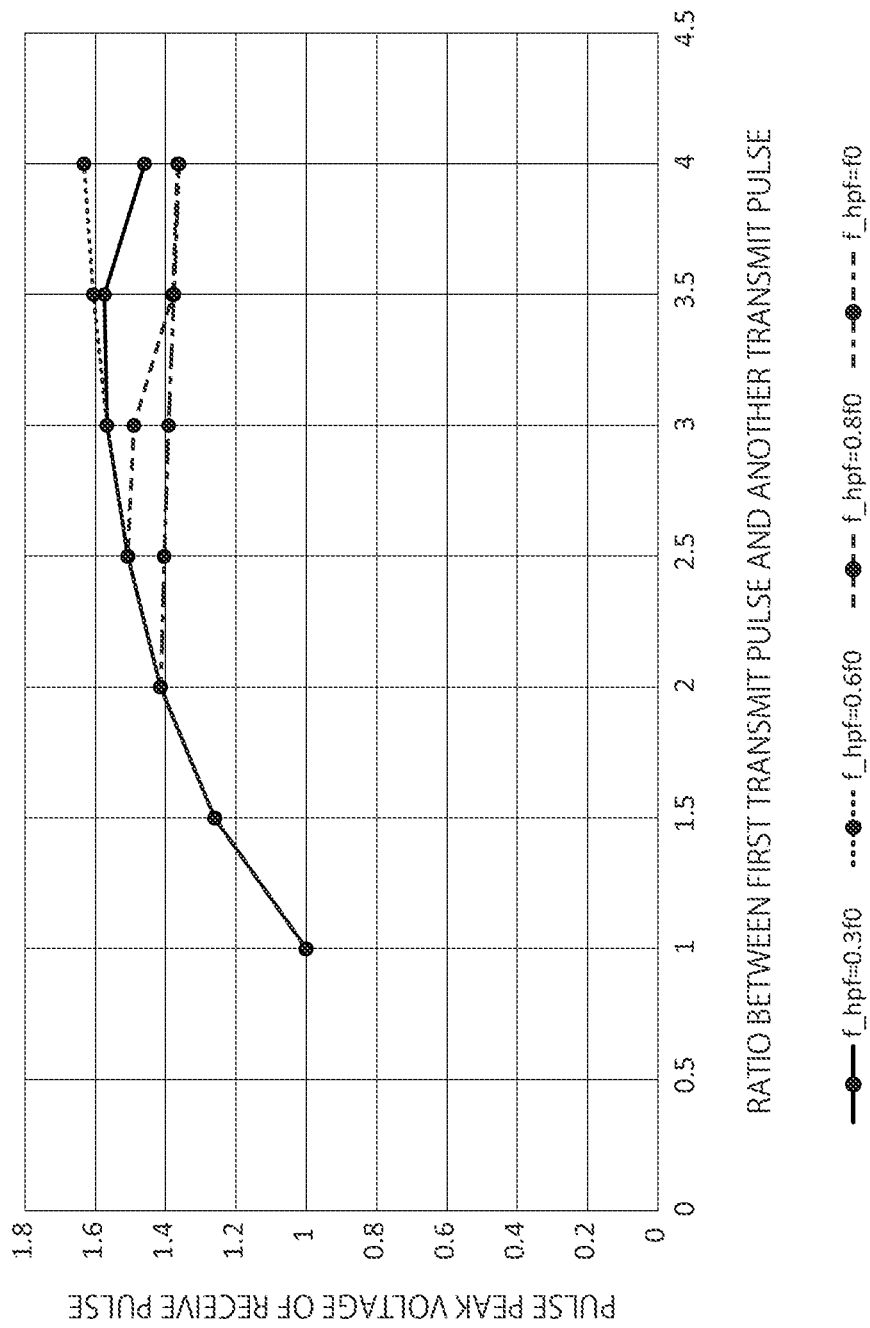
FIG. 12 is a diagram showing a ratio of a first receive pulse to a ratio between a first transmit pulse and another transmit pulse based on a condition under which power consumption is constant when the power consumption is proportional to the square of pulse amplitude.

FIG. 12 shows a ratio of a first receive pulse to a ratio between a first transmit pulse and another transmit pulse based on a condition under which power consumption is constant when the power consumption is proportional to the square of pulse amplitude.

The smallest pulse amplitude appearing on terminal C varies with fc_hpf of the insulation element 200.

As shown in FIG. 11, with increases in the first transmit pulse of the insulation element 200 over the other transmit pulse, the ratio of the first receive pulse increases as well. FIG. 11 shows the ratio of the first receive pulse with reference to the first receive pulse when the ratio between the first transmit pulse and the other transmit pulse is 1.

For example, when fc_hpf is 0.3f0 and the ratio between the first transmit pulse and the other transmit pulse is 1, the ratio of the magnitude of the first receive pulse is also 1. However, with increases in the ratio between the first transmit pulse and the other transmit pulse, i.e., with increases in the first transmit pulse over the other transmit pulse, the ratio of the first receive pulse increases as well.

Increases in the first receive pulse, which is the smallest, result in improved reception performance.

Whereas in FIG. 11, description has been given of a case in which power consumption is proportional to pulse amplitude, a similar tendency is exhibited when power consumption is proportional to the square of pulse amplitude as shown in FIG. 12. FIG. 12 also shows the ratio of the first receive pulse with reference to the first receive pulse when the ratio between the first transmit pulse and the other transmit pulse is 1.

For example, when fc_hpf is 0.3f0, if the ratio between the first transmit pulse and the other transmit pulse is 1, the ratio of the magnitude of the first receive pulse is also 1. However, with increases in the ratio between the first transmit pulse and the other transmit pulse, i.e., with increases in the first transmit pulse over the other transmit pulse, the ratio of the first receive pulse increases as well.

Increases in the first receive pulse, which is the smallest, result in improved reception performance.

Thus, increasing the amplitude of the first transmit pulse eliminates the need to increase the amplitudes of all the transmit pulses and makes it possible to improve the reception performance of the transmitting-receiving circuitry 1000 without increasing the power consumption of the transmitting circuitry 100.

(Variation 1)

Figure 13:
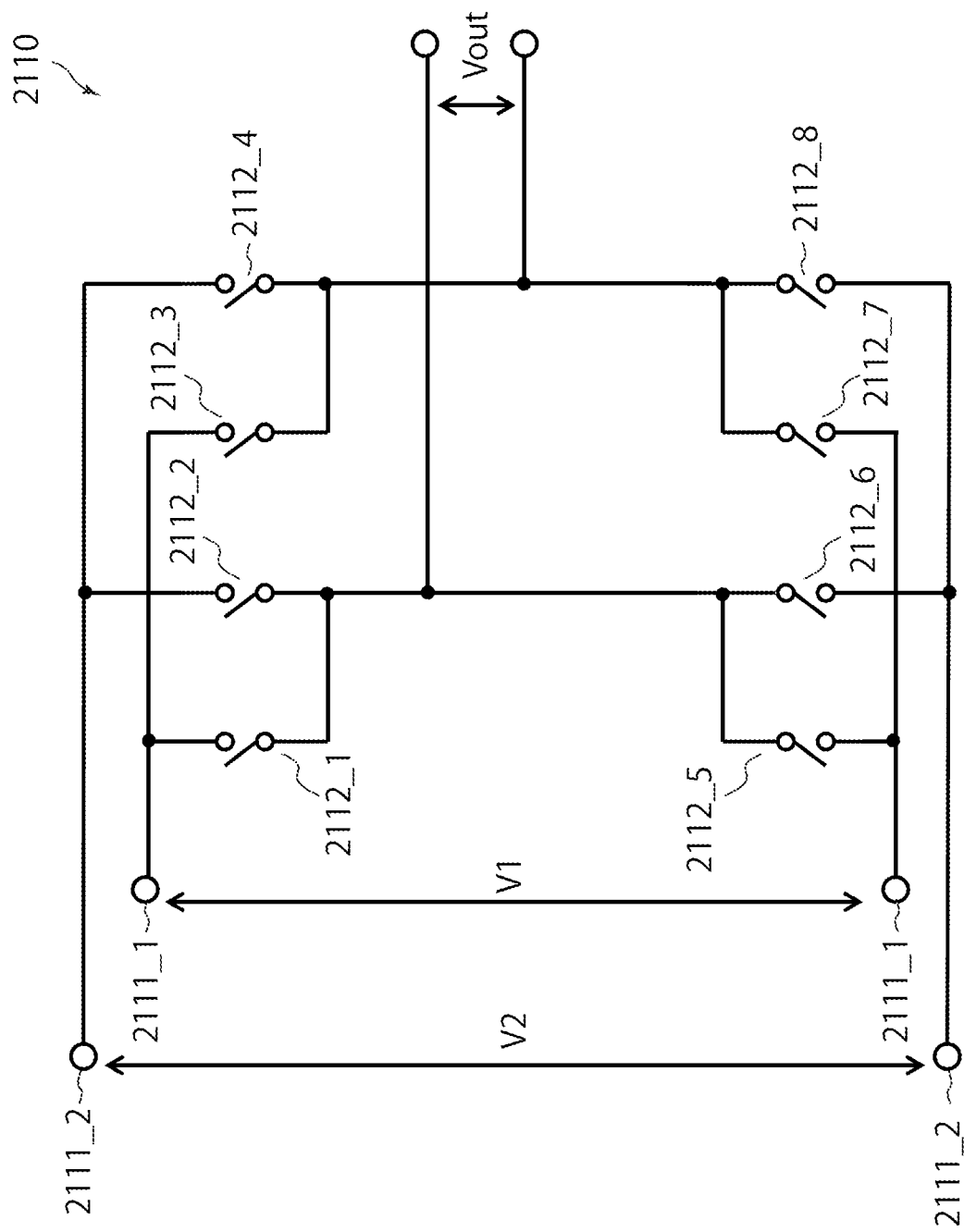
FIG. 13 is a diagram showing a configuration of a transmit pulse generation circuit according to a variation.
Figure 14:
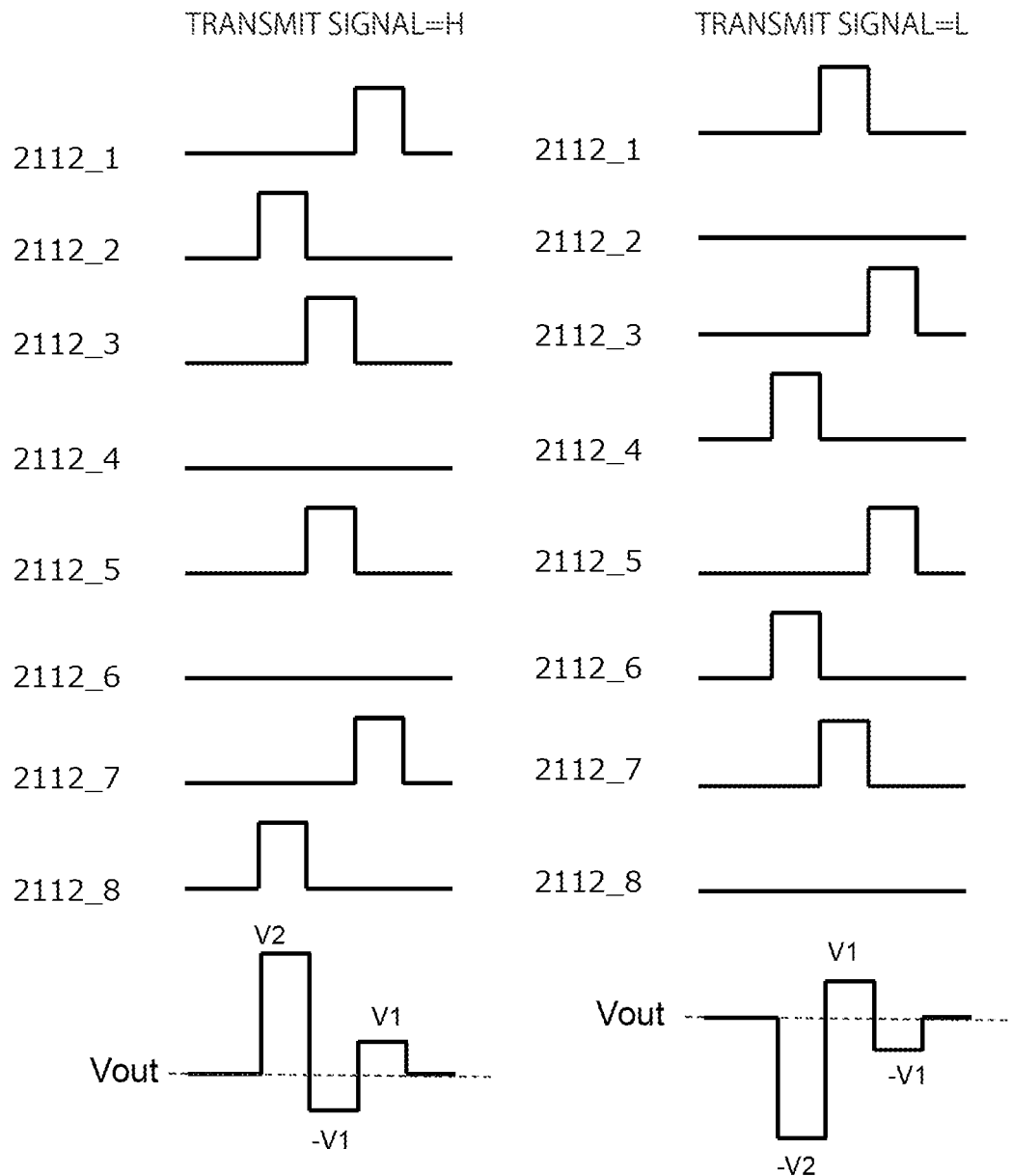
FIG. 14 is a diagram showing activation and deactivation of switches during signal transmission.

FIG. 13 shows a configuration of a transmit pulse generation circuit 2110 according to Variation 1. FIG. 14 shows activation and deactivation of switches during signal transmission.

According to Variation 1, transmitting-receiving circuitry 2000 includes transmitting circuitry 2100. Except for the transmitting circuitry 2100, a configuration of the transmitting-receiving circuitry 2000 is the same as that of the transmitting-receiving circuitry 1000, and thus description thereof will be omitted.

The transmitting circuitry 2100 includes the transmit pulse generation circuit 2110 and the control signal generation circuit 120.

The transmit pulse generation circuit 2110 generates transmit pulses using voltage pulses.

The transmit pulse generation circuit 2110 includes terminals 2111_1 and 2111_2 with a voltage V1 and a voltage V2 higher than the voltage V1 applied thereto, respectively, as well as switches 2112_1 to 2111_8.

Whereas in the description given here, eight switches are provided, the number of switches is not limited to this.

The switches 2112 may be, for example, digital circuits such as transistors or integrated circuits (ICs) as with the switches 112.

For example, to transmit an H signal, in the first transmit pulse, the switches 2112_2 and 2112_8 are turned ON simultaneously, thereby outputting the voltage V2 to Vout.

Next, in the second transmit pulse, the switches 2112_3 and 2112_5 are turned ON simultaneously, thereby outputting a voltage −V1 to Vout.

Finally, in the third transmit pulse, the switches 2112_1 and 2112_7 are turned ON simultaneously, thereby outputting a voltage V1 to Vout.

In other words, to transmit an H signal, as shown in FIG. 14, the switch 2112_1 is set to OFF, OFF, and ON in order.

Similarly, the switch 2112_2 is set to ON, OFF, and OFF in order. The switch 2112_3 is set to OFF, ON, and OFF in order. The switch 2112_4 is set to OFF, OFF, and OFF in order. The switch 2112_5 is set to OFF, ON, and OFF in order. The switch 2112_6 is set to OFF, OFF, and OFF in order. The switch 2112_7 is set to OFF, OFF, and ON in order. The switch 2112_8 is set to ON, OFF, and OFF in order.

Voltages are outputted to Vout in the following order: V2, −V1, and V1.

The first transmit pulse, the second transmit pulse, and the third transmit pulse are outputted in proportion to the output magnitude of the voltages. In other words, the first transmit pulse, which is outputted based on the voltage V2 higher than V1, becomes larger than the third transmit pulse.

For example, to transmit an L signal, in the first transmit pulse, the switches 2112_4 and 2112_6 are turned ON simultaneously, thereby outputting a voltage −V2 to Vout.

Next, in the second transmit pulse, the switches 2112_1 and 2112_7 are turned ON simultaneously, thereby outputting a voltage V1 to Vout.

Finally, in the third transmit pulse, the switches 2112_3 and 2112_5 are turned ON simultaneously, thereby outputting a voltage V1 to Vout.

In other words, to transmit an L signal, as shown in FIG. 14, the switch 2112_1 is set to OFF, OFF, and ON in order.

Similarly, the switch 2112_2 is set to OFF, OFF, and OFF in order. The switch 2112_3 is set to OFF, OFF, and ON in order. The switch 2112_4 is set to ON, OFF, and OFF in order. The switch 2112_5 is set to OFF, OFF, and ON in order. The switch 2112_6 is set to ON, OFF, and OFF in order. The switch 2112_7 is set to OFF, ON, and OFF in order. The switch 2112_8 is set to OFF, OFF, and OFF in order.

Voltages are outputted to Vout in the following order: −V2, V1, and −V1.

The first transmit pulse, the second transmit pulse, and the third transmit pulse are outputted in proportion to the output magnitude of the voltages. In other words, the first transmit pulse, which is outputted based on the voltage V2 higher than V1, becomes larger than the third transmit pulse.

According to Variation 1, the transmit pulses transmitted by the transmitting circuitry 2100 may be, for example, differential voltage pulses other than current pulses.

(Variation 2)

Figure 15:
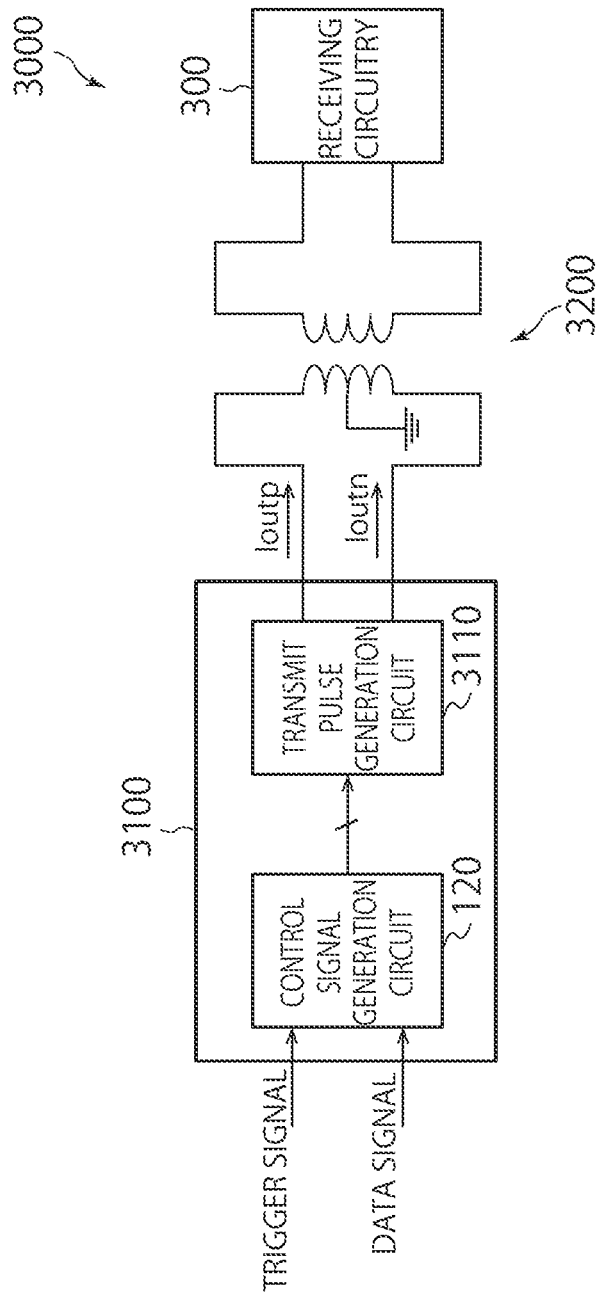
FIG. 15 is a diagram showing an overall configuration of transmitting-receiving circuitry according to a variation.
Figure 16:
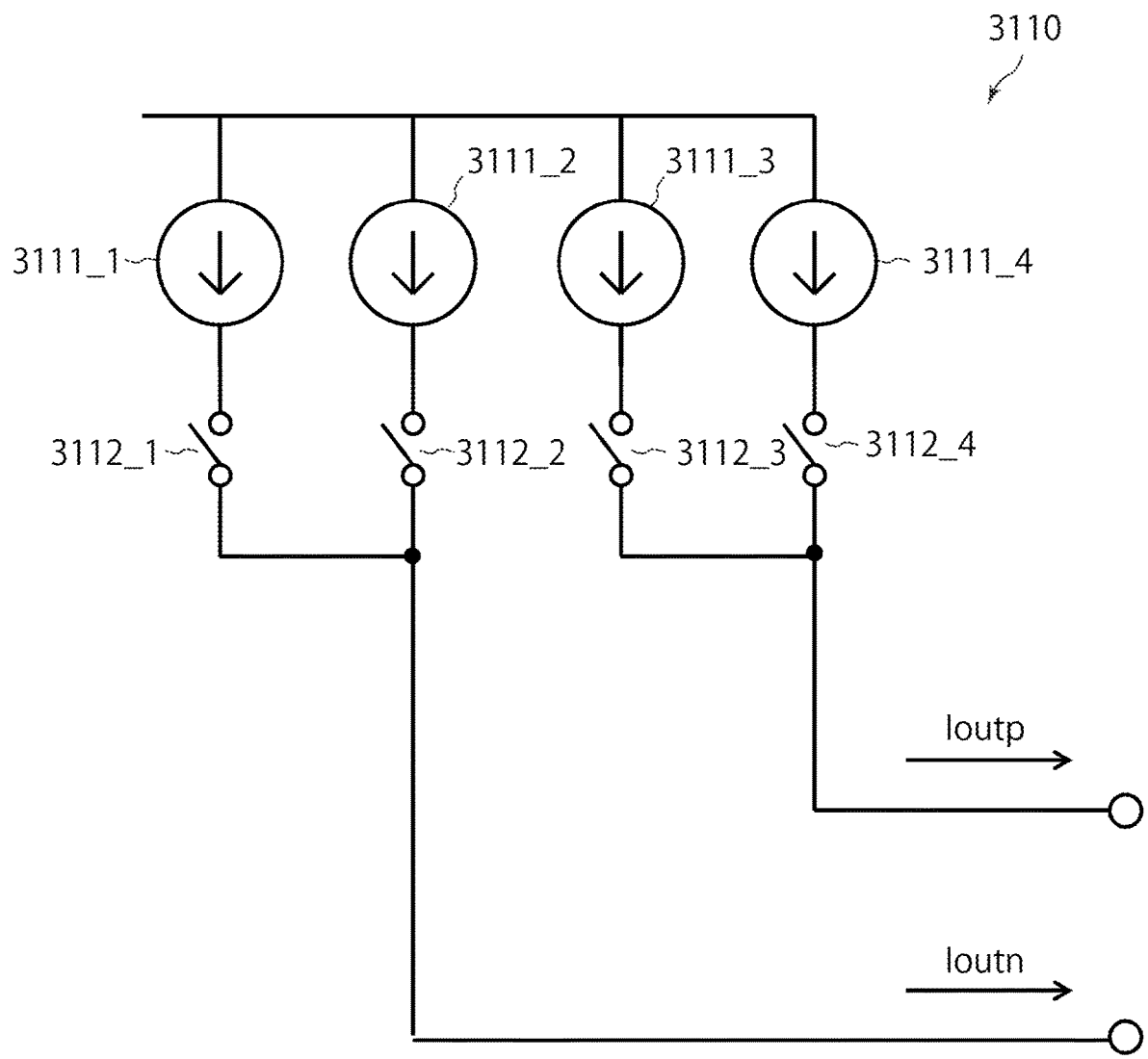
FIG. 16 is a diagram showing a circuit configuration of a transmit pulse generation circuit according to a variation.
Figure 17:
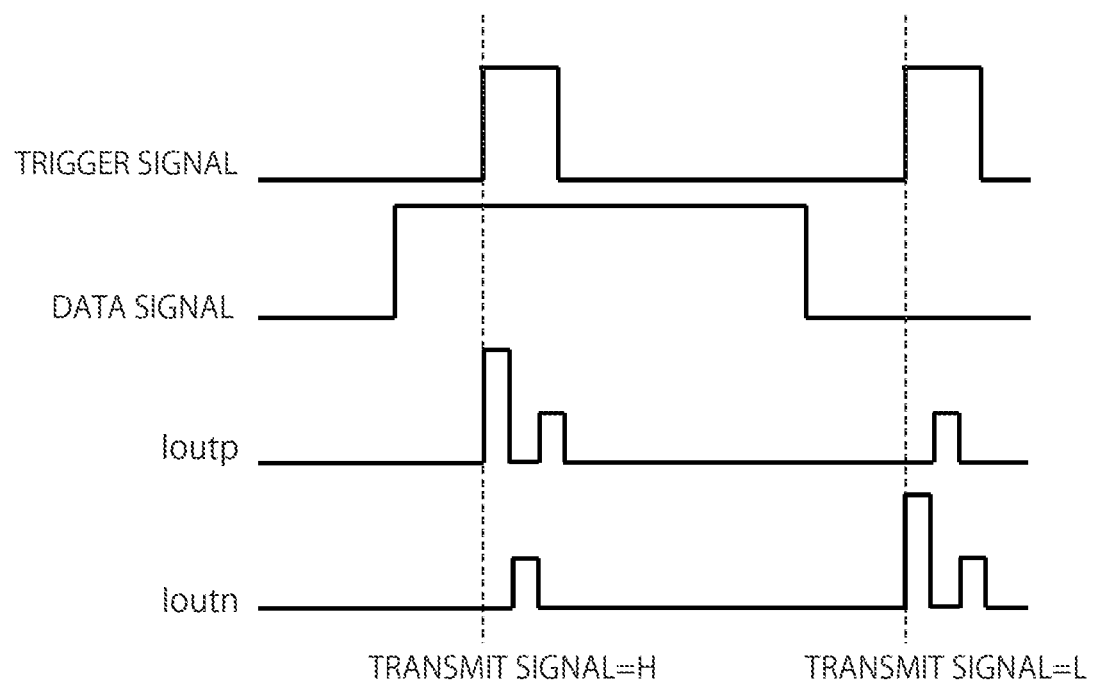
FIG. 17 is a diagram showing a transmit signal outputted in combination with a trigger signal and a data signal.
Figure 18:
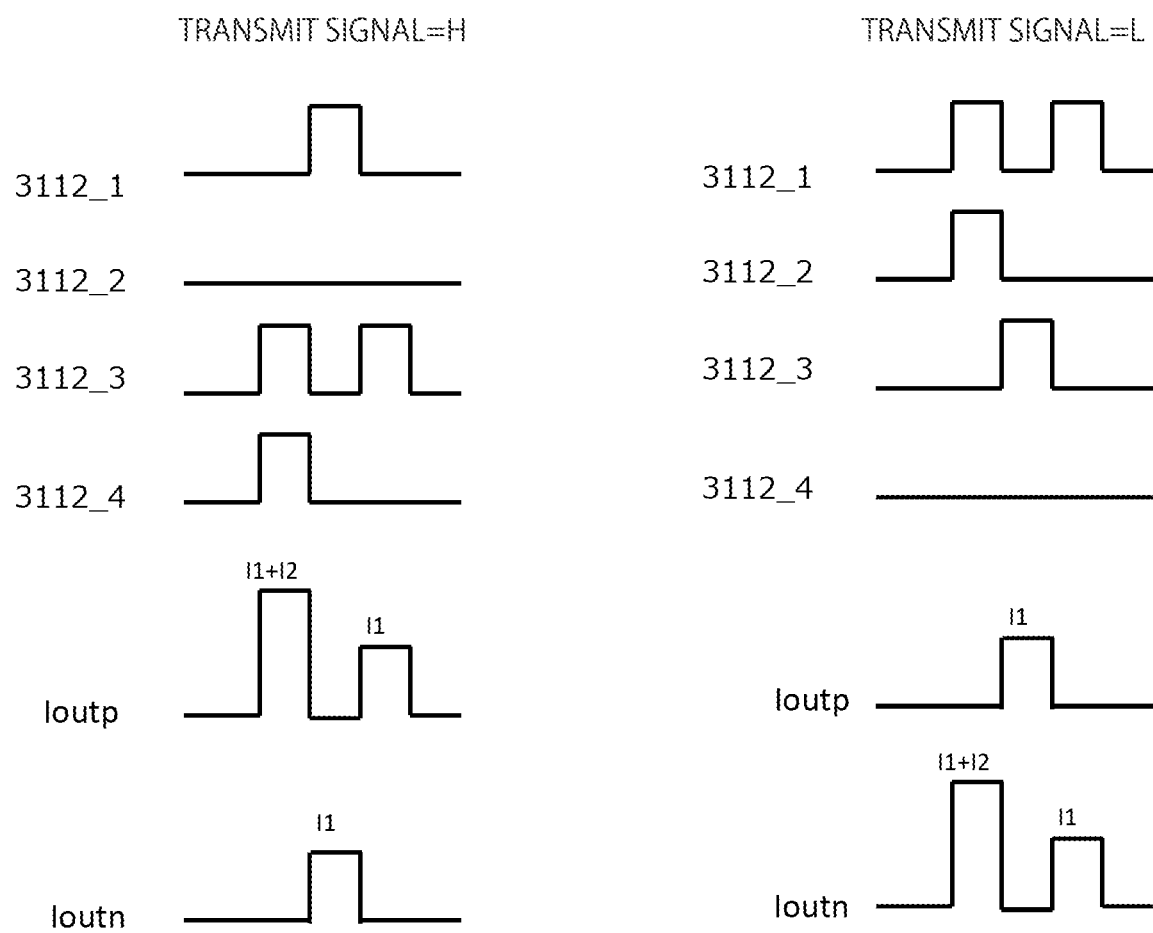
FIG. 18 is a diagram showing activation and deactivation of switches during signal transmission.

FIG. 15 shows an overall configuration of transmitting-receiving circuitry 3000 according to Variation 2. FIG. 16 shows a circuit configuration of a transmit pulse generation circuit 3110 according to Variation 2. FIG. 17 shows a transmit signal outputted in combination with a trigger signal and a data signal. FIG. 18 shows activation and deactivation of switches during signal transmission.

According to Variation 2, transmitting-receiving circuitry 3000 includes transmitting circuitry 3100 and an insulation element 3200. Except for the transmitting circuitry 3100 and the insulation element 3200, a configuration of the transmitting-receiving circuitry 3000 is the same as that of the transmitting-receiving circuitry 1000, and thus description thereof will be omitted.

The transmit pulses transmitted by the transmitting circuitry 3100 may be, for example, pseudo differential current pulses other than differential current pulses.

The transmitting circuitry 3100 includes the transmit pulse generation circuit 3110 adapted to generate transmit pulses based on pseudo differential current pulses as well as the control signal generation circuit 120.

By being connected, for example, with the insulation element 3200 whose midpoint is connected to a ground point, the transmit pulse generation circuit 3110 can also deal with a situation in which Ioutp and Ioutn outputted for the pseudo differential configuration do not become equal to each other.

If connected to a ground point, the insulation element 3200 may be made up of an element such as a capacitor or a condenser other than an isolation transformer.

For example, as shown in FIG. 17, at a time when a rising edge of a trigger signal is detected and the data signal is shown to be High, the transmit pulse generation circuit 3110 transmits an H signal.

For example, at a time when a rising edge of a trigger signal is detected and the data signal is shown to be Low, the transmit pulse generation circuit 3110 transmits an L signal.

The transmit pulse generation circuit 3110 includes current sources 3111_1 to 3111_4 and switches 3112_1 to 3112_4.

Whereas in the description given here, four current sources and four switches are provided, the numbers of current sources and switches are not limited to this.

The switches 3112 may be, for example, digital circuits such as transistors or integrated circuits (ICs) as with the switches 112.

For example, to transmit an H signal, in the first transmit pulse, the switches 3112_3 and 3112_4 are turned ON simultaneously, thereby outputting a current I1+I2 to Ioutp.

Next, in the second transmit pulse, the switch 3112_1 is turned ON, thereby outputting a current I1 to Ioutn.

Finally, in the third transmit pulse, the switch 3112_3 is turned ON, thereby outputting a current I1 to Ioutp.

In other words, to transmit an H signal, as shown in FIG. 18, the switch 3112_1 is set to OFF, ON, and OFF in order.

Similarly, the switch 3112_2 is set to OFF, OFF, and OFF in order. The switch 3112_3 is set to ON, OFF, and ON in order. The switch 3112_4 is set to ON, OFF, and OFF in order.

The currents flowing through Ioutp are outputted in the following order: I1+I2, no output, and I1. The currents flowing through Ioutn are outputted in the following order: no output, I1, and no output.

The first transmit pulse and the third transmit pulse are outputted in proportion to the output magnitude of the current flowing through Ioutp. The second transmit pulse is outputted in proportion to the output magnitude of the current flowing through Ioutn.

In other words, the first transmit pulse, which is outputted based on a current larger by I2, becomes larger than the third transmit pulse.

For example, to transmit an L signal, in the first transmit pulse, the switches 3112_1 and 3112_2 are turned ON simultaneously, thereby outputting a current I1+I2 to Ioutn.

Next, in the second transmit pulse, the switch 3112_3 is turned ON, thereby outputting a current I1 to Ioutp.

Finally, in the third transmit pulse, the switch 3112_1 is turned ON, thereby outputting a current I1 to Ioutn.

In other words, to transmit an L signal, as shown in FIG. 18, the switch 3112_1 is set to ON, OFF, and ON in order.

Similarly, the switch 3112_2 is set to ON, OFF, and OFF in order.

The switch 3112_3 is set to OFF, ON, and OFF in order. The switch 3112_4 is set to OFF, OFF, and OFF in order.

The currents flowing through Ioutp are outputted in the following order: no output, I1, and no output. The currents flowing through Ioutn are outputted in the following order: I1+I2, no output, and I1.

The first transmit pulse and the third transmit pulse are outputted in proportion to the output magnitude of the current flowing through Ioutn. The second transmit pulse is outputted in proportion to the output magnitude of the current flowing through Ioutp.

In other words, the first transmit pulse, which is outputted based on a current larger by I2, becomes larger than the third transmit pulse.

According to Variation 2, the transmit pulses transmitted by the transmitting circuitry may be current pulses based on pseudo differential current.

(Variation 3)

Figure 19:
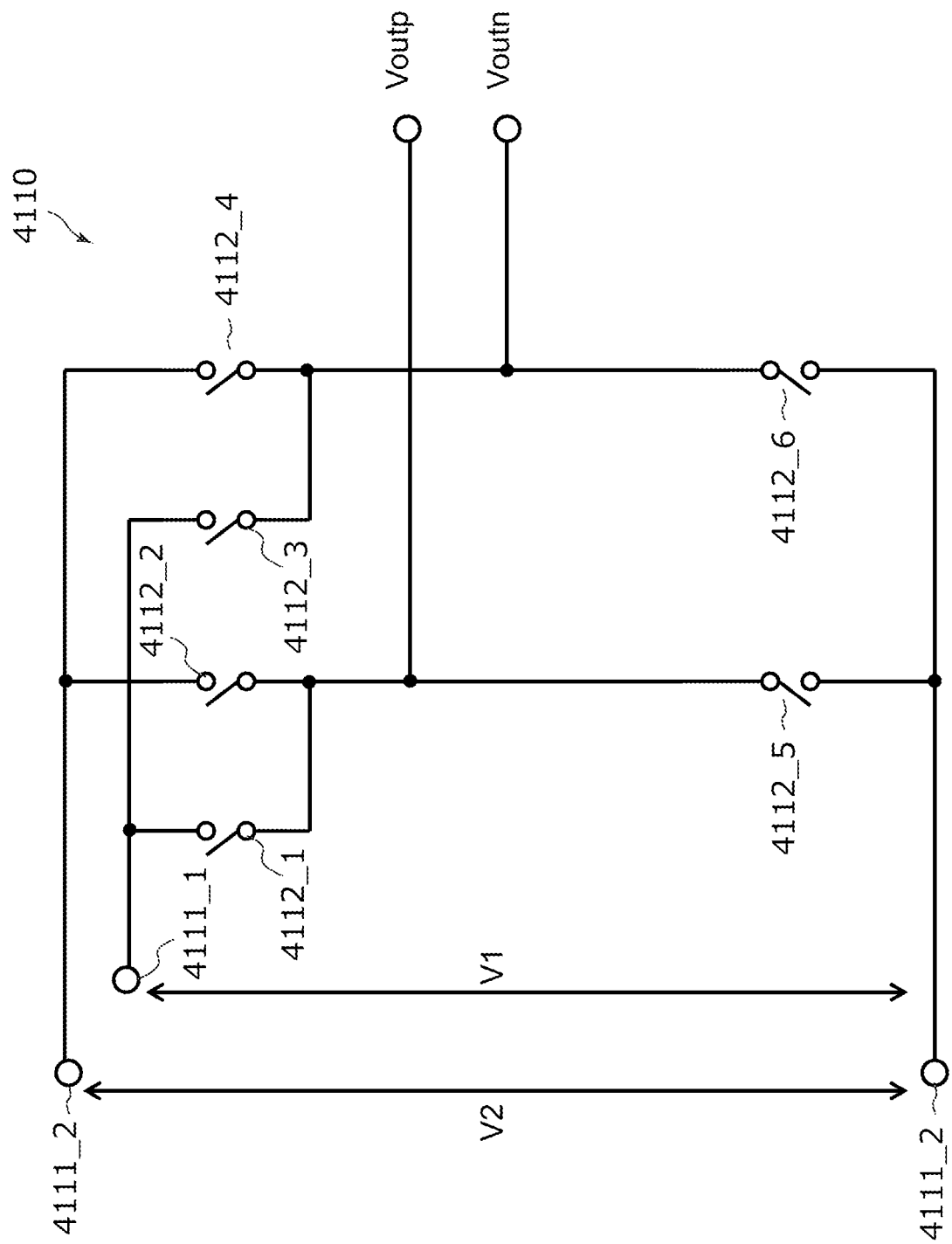
FIG. 19 is a diagram showing a structure of a transmit pulse generation circuit according to a variation.
Figure 20:
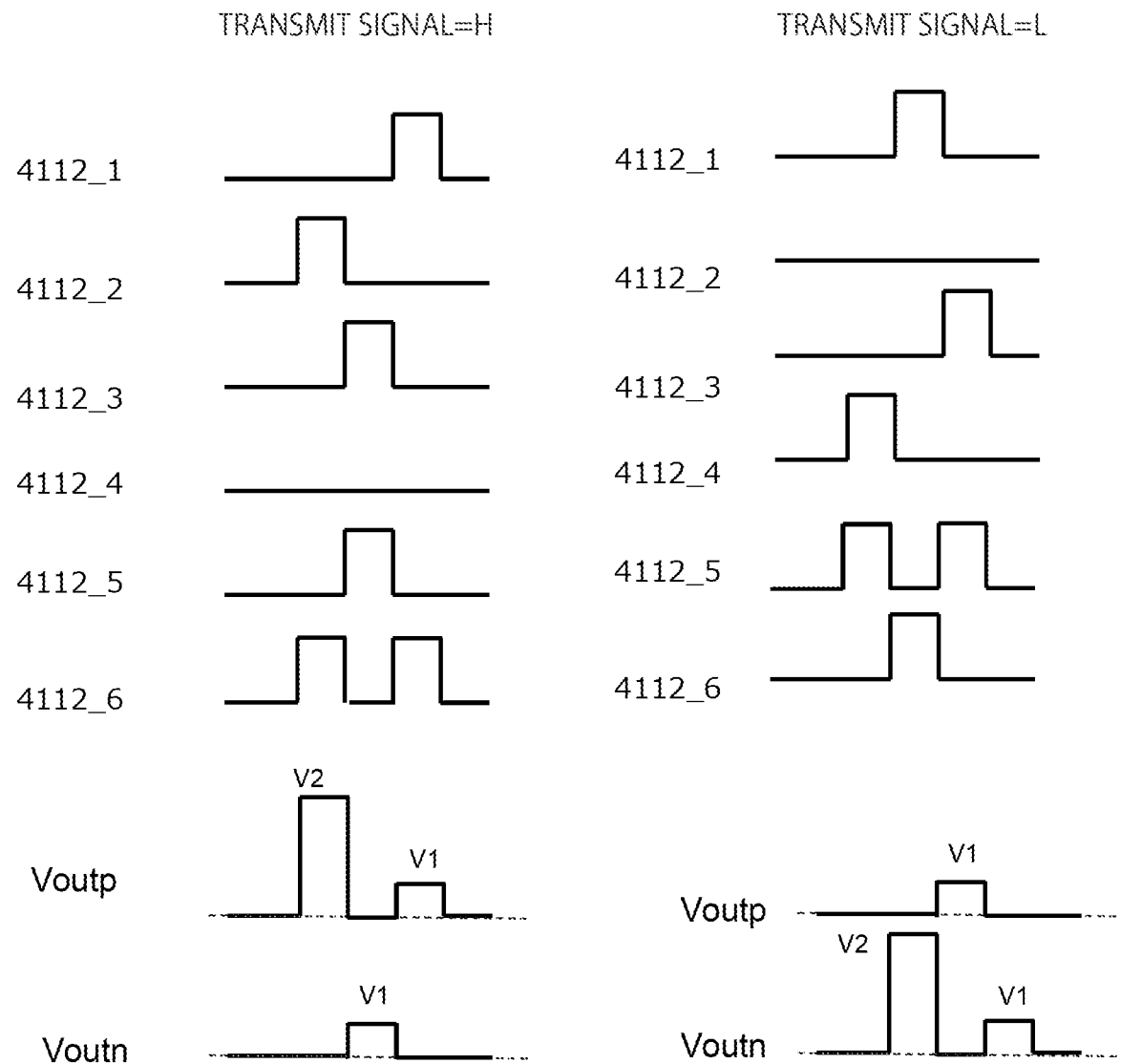
FIG. 20 is a diagram showing activation and deactivation of switches during signal transmission.

FIG. 19 shows a structure of a transmit pulse generation circuit 4110 according to Variation 3. FIG. 20 shows activation and deactivation of switches during signal transmission.

According to Variation 3, transmitting-receiving circuitry 4000 includes transmitting circuitry 4100. Except for the transmitting circuitry 4100, a configuration of the transmitting-receiving circuitry 4000 is the same as that of the transmitting-receiving circuitry 3000, and thus description thereof will be omitted. The transmitting circuitry 4100 outputs a transmit signal in combination with the trigger signal and data signal, for example, shown in FIG. 17.

The transmit pulses transmitted by the transmitting circuitry 4100 may be pseudo differential voltage pulses.

The transmitting circuitry 4100 includes the transmit pulse generation circuit 4110 adapted to generate transmit pulses based on pseudo differential voltage pulses as well as the control signal generation circuit 120.

By being connected, for example, with the insulation element 3200 whose midpoint is connected to a ground point the transmit pulse generation circuit 4110 can also deal with a situation in which Voutp and Voutn outputted for the pseudo differential configuration do not become equal to each other.

For example, as shown in FIG. 17, at a time when a rising edge of a trigger signal is detected and the data signal is shown to be High, the transmit pulse generation circuit 4110 transmits an H signal.

For example, at a time when a rising edge of a trigger signal is detected and the data signal is shown to be Low, the transmit pulse generation circuit 4110 transmits an L signal.

The transmit pulse generation circuit 4110 includes terminals 4111_1 and 4111_2 with a voltage V1 and a voltage V2 higher than the voltage V1 applied thereto, respectively, as well as switches 4112_1 to 4111_6.

Whereas in the description given here, six switches are provided, the number of switches is not limited to this.

The switches 4112 may be, for example, digital circuits such as transistors or integrated circuits (ICs) as with the switches 112.

For example, to transmit an H signal, in the first transmit pulse, the switches 4112_2 and 4112_6 are turned ON simultaneously, thereby outputting the voltage V2 to Voutp.

Next, in the second transmit pulse, the switches 4112_3 and 4112_5 are turned ON simultaneously, thereby outputting a voltage V1 to Voutn.

Finally, in the third transmit pulse, the switches 4112_1 and 4112_6 are turned ON simultaneously, thereby outputting a voltage V1 to Voutp.

In other words, to transmit an H signal, as shown in FIG. 20, the switch 4112_1 is set to OFF, OFF, and ON in order.

Similarly, the switch 4112_2 is set to ON, OFF, and OFF in order. The switch 4112_3 is set to OFF, ON, and OFF in order. The switch 4112_4 is set to OFF, OFF, and OFF in order. The switch 4112_5 is set to OFF, ON, and OFF in order. The switch 4112_6 is set to ON, OFF, and ON in order.

Voltages are outputted to Voutp in the following order: V2, no output, and V1. Voltages are outputted to Voutn in the following order: no output, V1, and no output.

The first transmit pulse and the third transmit pulse are outputted to Voutp in proportion to the output magnitudes of the voltages. The second transmit pulse is outputted to Voutn in proportion to the output magnitudes of the voltages.

In other words, the first transmit pulse, which is outputted based on the voltage V2 higher than V1, becomes larger than the third transmit pulse.

According to Variation 3, the transmit pulses transmitted by the transmitting circuitry 4100 may be pseudo differential voltage pulses.

(Variation 4)

Figure 21:
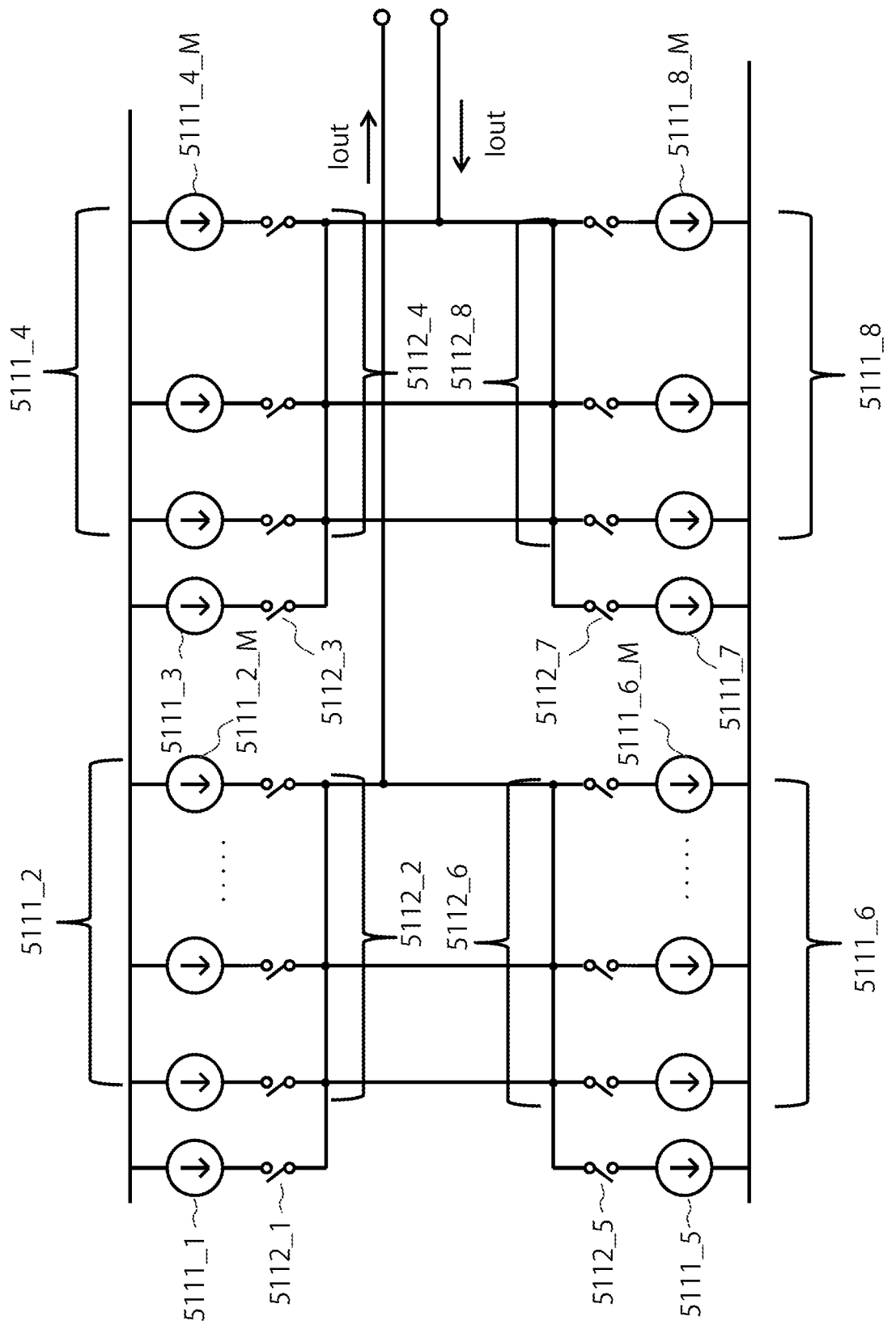
FIG. 21 is a diagram showing a structure of a transmit pulse generation circuit.

FIG. 21 shows a structure of a transmit pulse generation circuit 5110 according to Variation 4.

According to Variation 4, transmitting-receiving circuitry 5000 includes transmitting circuitry 5100. Except for the transmit pulse generation circuit 5110, a configuration of the transmitting-receiving circuitry 5000 is the same as that of the transmitting-receiving circuitry 1000, and thus description thereof will be omitted.

The transmit pulse generation circuit 5110 can vary an increase ratio n at which the amplitude of the first transmit pulse is increased.

An optimum amplitude of the first transmit pulse is affected greatly by filter characteristics of a path through which signals are transferred.

The insulation element 200 connected with the transmit pulse generation circuit 5110 functions as a band-pass filter whose characteristics can be predicted in advance.

However, due to manufacturing variations as well as ambient temperature and environment at/in which the insulation element 200 is used, the filter characteristics may fluctuate widely.

In such a case, it is difficult to predict, in advance, the filter characteristics of the insulation element 200 functioning as a band-pass filter.

By changing an amplitude increase ratio n of the first transmit pulse according to the fluctuating filter characteristics, the transmit pulse generation circuit 5110 can increase the amplitude of the first transmit pulse to the optimum amplitude regardless of the filter characteristics.

The transmit pulse generation circuit 5110 includes current sources 5111_1, 5111_3, 5111_5, and 5111_7 each of which passes a single current I1, current sources 5111_2, 5111_4, 5111_6, and 5111_8 each of which passes one or more (M) currents I2, and switches 5112_1 to 5112_8 connected to the respective current sources.

The switches 5112 may be, for example, digital circuits such as transistors or integrated circuits (ICs) as with the switches 112.

The switches 5112_1 to 5112_8, which are connected to the respective current sources 5111_1 to 5111_8, pass currents when turned on.

The current sources 5111_2, 5111_4, 5111_6, and 5111_8, each of which passes M currents I2, can change the values of the currents to be passed, by adjusting the number of switches to be turned on.

Consequently, by selecting, according to characteristics of a transfer path (transmission path), how many times another pulse the amplitude of the first transmit pulse should be, it is possible to increase the amplitude of the first transmit pulse at an appropriate increase ratio n regardless of the characteristics of the transfer path.

(Variation 5)

Figure 22:
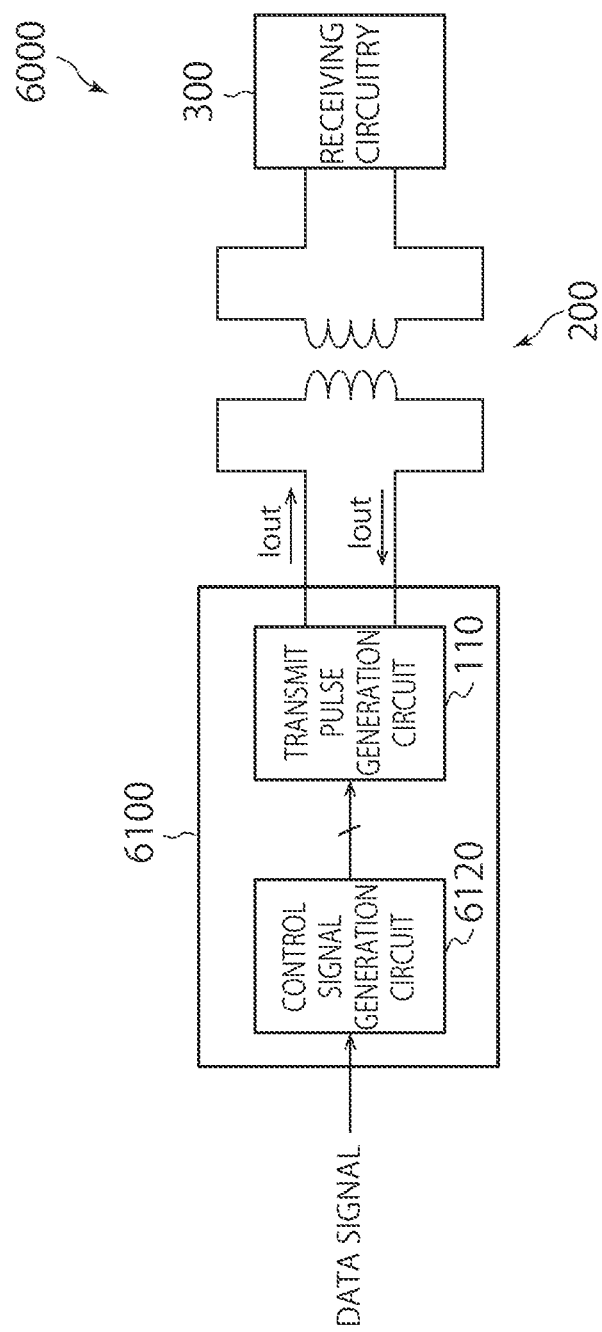
FIG. 22 is a diagram showing an overall configuration of transmitting-receiving circuitry according to a variation.

FIG. 22 shows an overall configuration of transmitting-receiving circuitry 6000 according to Variation 5.

Figure 23:
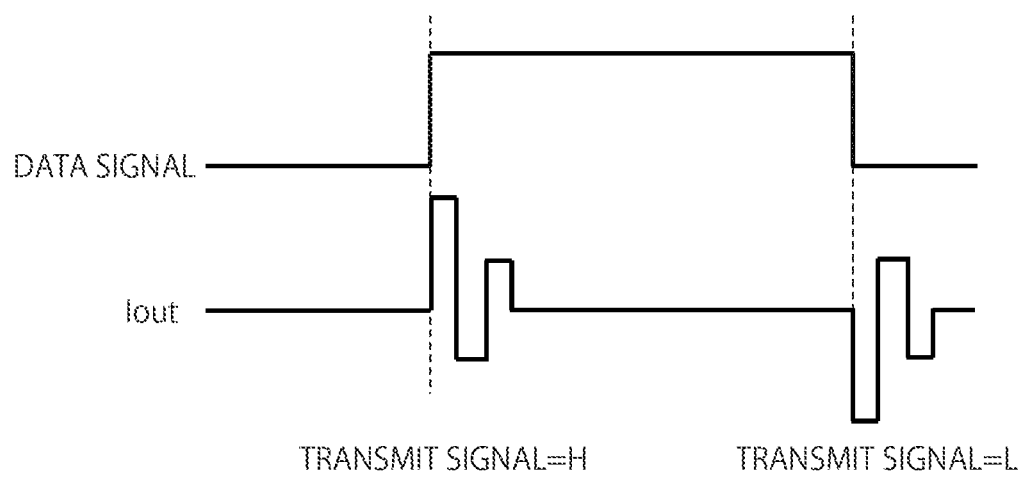
FIG. 23 is a diagram showing a transmit signal outputted in combination with a data signal.

FIG. 23 shows a transmit signal outputted in combination with a data signal.

According to Variation 5, the transmitting-receiving circuitry 6000 includes transmitting circuitry 6100. Except for the transmitting circuitry 6100, a configuration of the transmitting-receiving circuitry 6000 is the same as that of the transmitting-receiving circuitry 1000, and thus description thereof will be omitted.

The transmitting circuitry 6100 includes the transmit pulse generation circuit 110 and a control signal generation circuit 6120.

The control signal generation circuit 6120 generates control signals for use to control the operation of the switches included in the transmit pulse generation circuit 110. Specifically, the control signal generation circuit 6120 controls switch operation of the transmit pulse generation circuit 110 based on the data signal.

The data signal indicates the type of signal outputted by a transmit pulse. The data signal allows determination as to whether the data signal is High or Low.

The control signal generation circuit 6120 controls the switches included in the transmit pulse generation circuit 110 such that transmit pulses will be outputted according to changes of the data signal between High and Low.

According to Variation 5, when a rising edge of the data signal is detected, the control signal generation circuit 6120 transmits an H signal. When a falling edge of the data signal is detected, the control signal generation circuit 6120 transmits an L signal.

The data signal may be an input signal that causes an analog waveform (first waveform) to be outputted, in response to transition of the data signal.

According to Variation 5, the control signal generation circuit 6120 can control transmission and reception of signals using the data signal.

(Variation 6)

Figure 24:
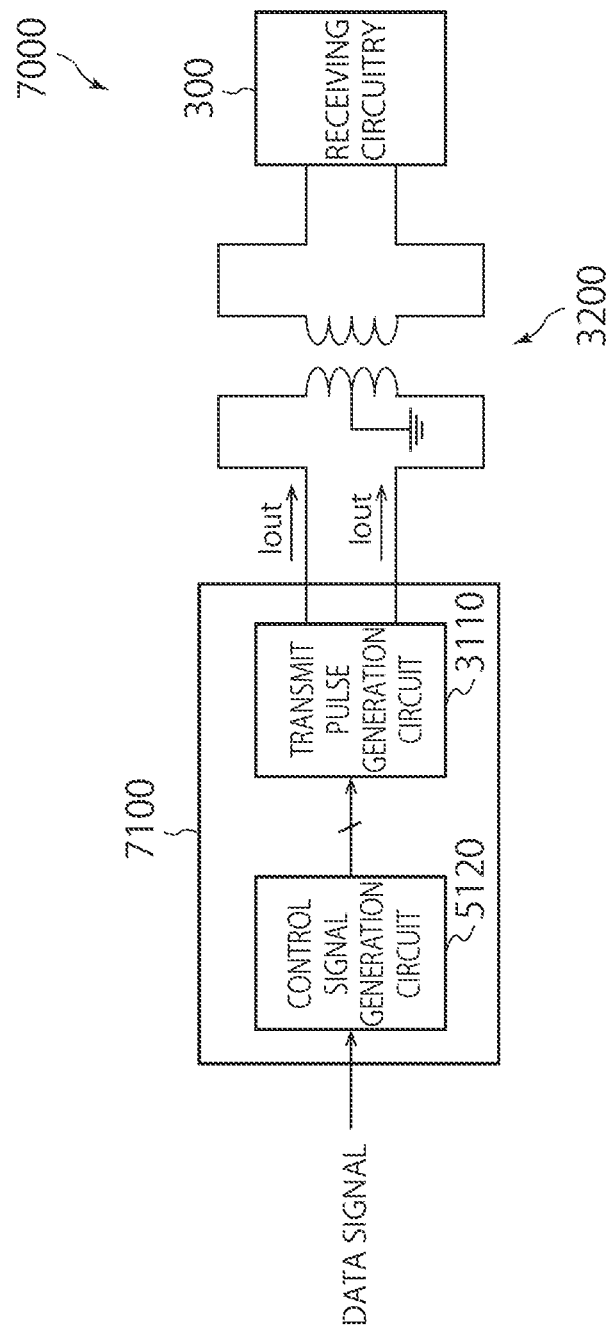
FIG. 24 is a diagram showing an overall configuration of transmitting-receiving circuitry according to a variation.

FIG. 24 shows an overall configuration of transmitting-receiving circuitry 7000 according to Variation 6.

Figure 25:
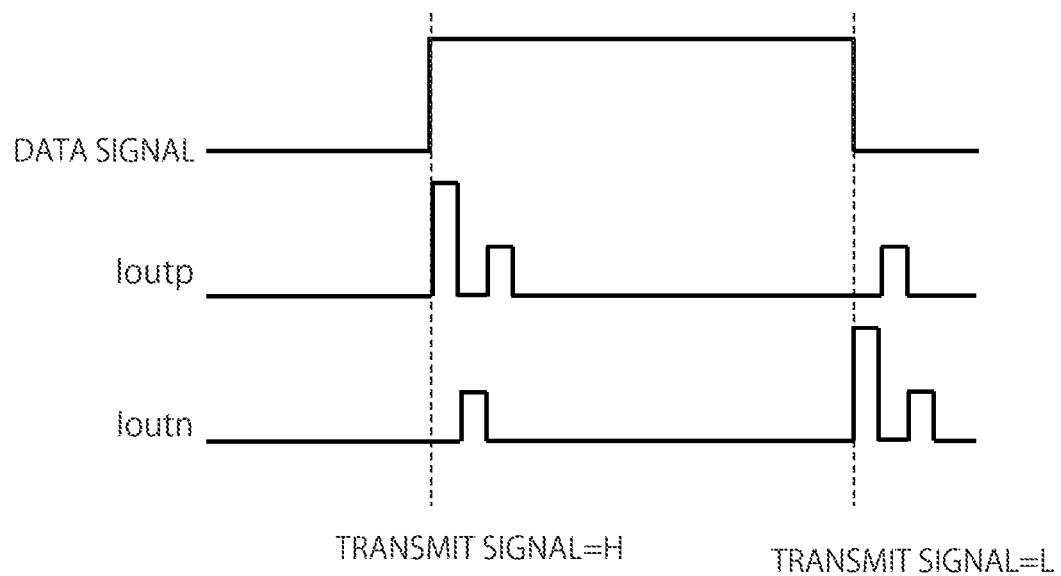
FIG. 25 is a diagram showing a transmit signal outputted in combination with a data signal.

FIG. 25 shows a transmit signal outputted in combination with a data signal.

Transmitting circuitry 7100 of the transmitting-receiving circuitry 7000 includes the transmit pulse generation circuit 3110 and the control signal generation circuit 5120.

The control signal generation circuit 5120 that controls switch operation of the transmit pulse generation circuit 110 based on the data signal can be combined with the transmit pulse generation circuit 3110 that uses pseudo current pulses.

According to Variation 6, as shown in FIG. 25, when a rising edge of the data signal is detected, the control signal generation circuit 5120 transmits an H signal by transmitting a predetermined pulse from Ioutp and Ioutn. When a falling edge of the data signal is detected, the control signal generation circuit 5120 transmits an L signal by transmitting a predetermined pulse from Ioutp and Ioutn.

(Variation 7)

Figure 26:
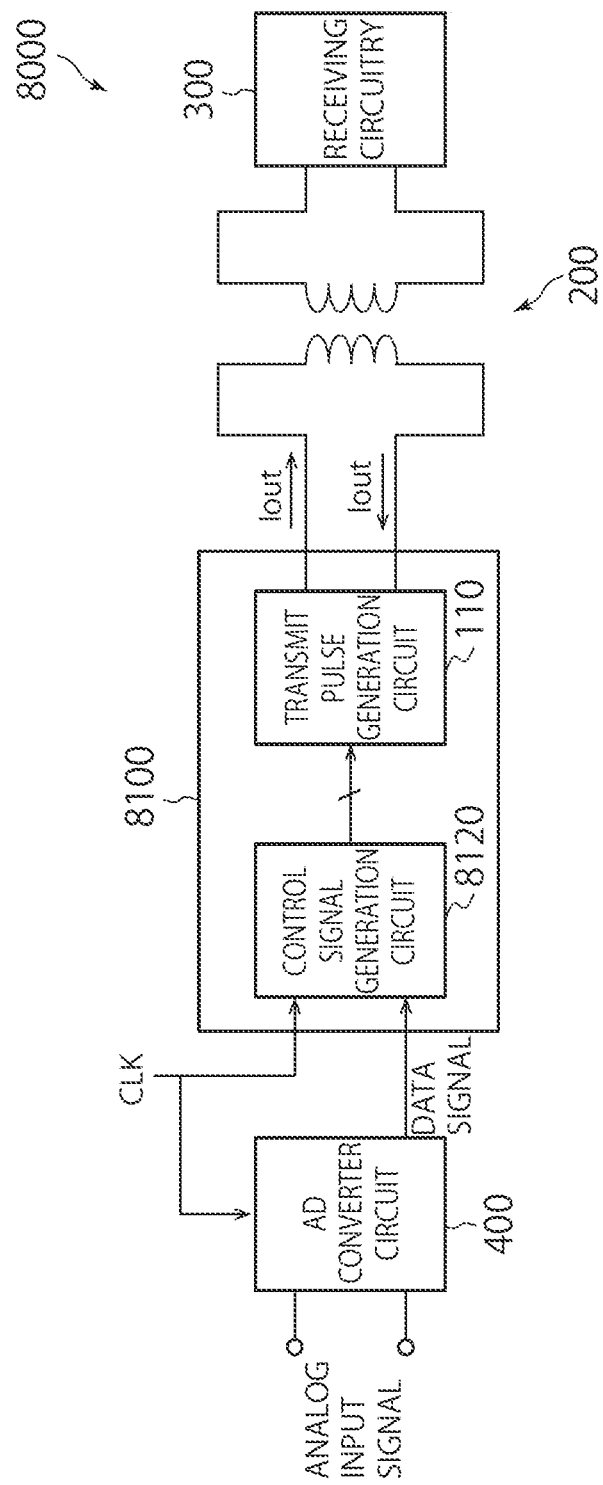
FIG. 26 is a diagram showing an overall configuration of transmitting-receiving circuitry according to a variation.

FIG. 26 shows an overall configuration of transmitting-receiving circuitry 8000 according to Variation 7.

The transmitting-receiving circuitry 8000 includes transmitting circuitry 8100, the insulation element 200, the receiving circuitry 300, and an AD converter circuit 400.

The transmitting circuitry 8100 includes the transmit pulse generation circuit 110 and a control signal generation circuit 8120.

The transmitting-receiving circuitry 8000 accepts analog input signals as input. The transmitting-receiving circuitry 8000 functions as an isolation amplifier that transmits analog signals in an insulated manner.

The AD converter circuit 400 converts analog input signals into digital input signals. The AD converter circuit 400 may also be called an AD converter.

The AD converter circuit 400, which is also called an analog-digital converter, can use a flash ADC, pipeline ADC, a $\Delta\Sigma$ modulator, and the like.

The AD converter circuit 400 and the control signal generation circuit 8120 accepts a CLK signal (clock signal) as input.

By being timed with the CLK signal, the AD converter circuit 400 converts an analog input signal into a digital signal and outputs the digital signal as a data signal.

Based on the CLK signal, the control signal generation circuit 8120 receives the data signal at timing which the output from the AD converter circuit 400 remains unchanged, and generates a control signal intended for the transmit pulse generation circuit 110.

For example, an output signal of the AD converter circuit 400 changes on a rising edge of the CLK signal, and the control signal generation circuit 8120 captures the data signal on the falling edge and generates a control signal.

Variation 7 makes it possible to convert an analog signal accepted as input into a digital signal and transmit the digital signal to the receiving circuitry 300.

(Variation 8)

Figure 27:
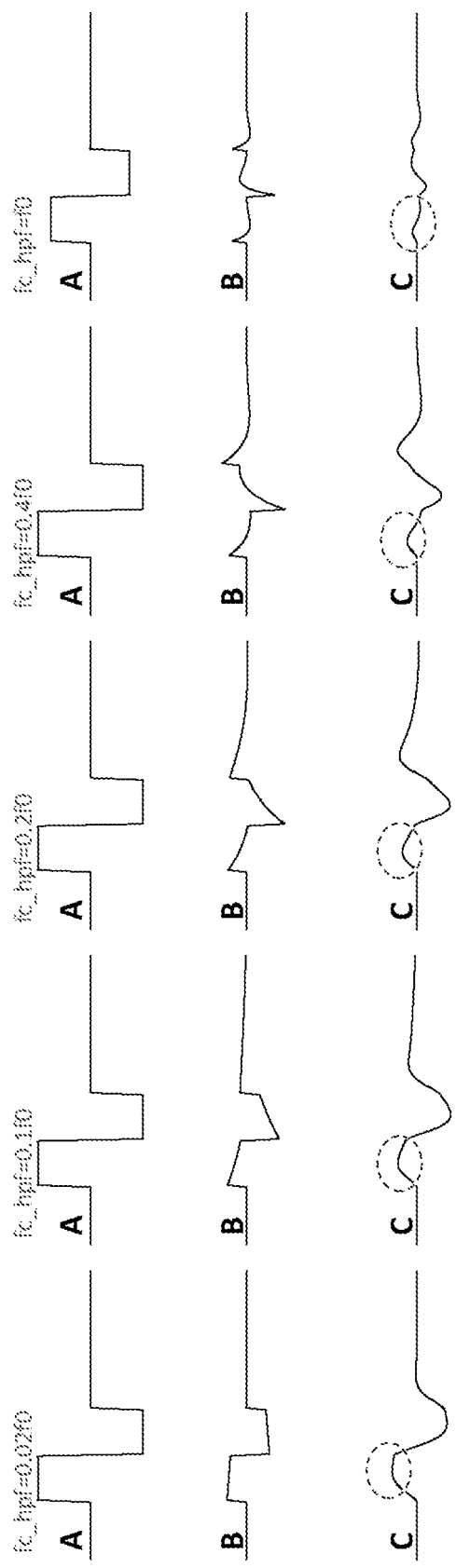
FIG. 27 is a diagram showing changes in pulses taking place on specific terminals when cut-off frequency of a high-pass filter is changed when there are two pulse waveforms.

FIG. 27 shows changes in pulses taking place on specific terminals when cut-off frequency of a high-pass filter 210 is changed when there are two pulse waveforms.

Figure 28:
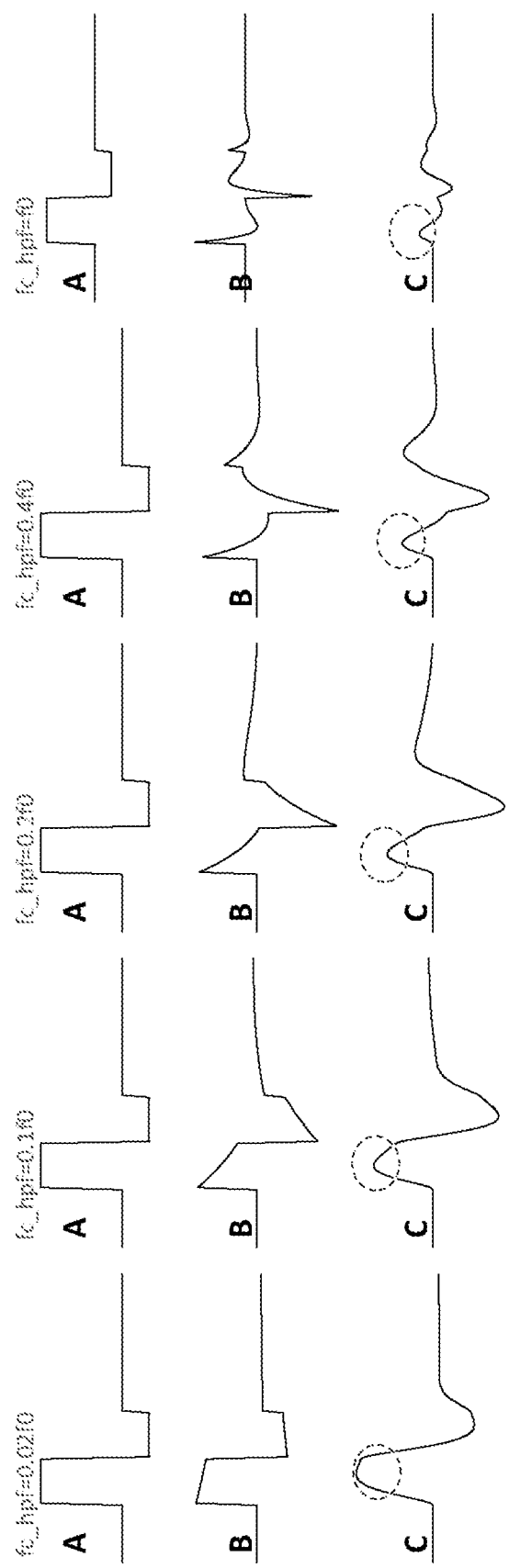
FIG. 28 is a diagram showing changes in pulses taking place when the pulses are transmitted by amplifying amplitude of a first transmit pulse in FIG. 27.

FIG. 28 shows changes in pulses taking place when the pulses are transmitted by amplifying amplitude of a first transmit pulse in FIG. 27.

With the transmitting-receiving circuitry 1000, the number N of pulse waveforms transmitted by the transmitting circuitry 100 may be other than three.

For example, with the transmitting-receiving circuitry 1000, when the number N of pulse waveforms is 2, the transmitting circuitry 100 transmits the input signal as an analog waveform made up of two successive pulse waveforms.

For example, the analog waveform can be regarded as a digital signal represented by two bits.

In the description given here, of the two pulses outputted by the transmitting circuitry 100, the pulse outputted first is designated as a first transmit pulse and the pulse outputted next is designated as a second transmit pulse.

When the cut-off frequency (fc_hpf) of the high-pass filter 210 is changed in a range of 0.02f0 to f0 on terminals A, B, and C in FIG. 6, resulting waveforms are shown as in FIG. 27.

Regarding the waveform measured on terminal A, the waveform measured on terminal B, and the waveform measured on terminal C in FIG. 6, as in the case where the number N of pulse waveforms is three, if appropriate cut-off frequencies are selected on the insulation element 200, an outline of the receive pulse measured on terminal C is reproduced.

Of the analog waveform measured on terminal B, a signal corresponding to a rising edge of the first transmit pulse is smaller than a signal corresponding to an edge of the second transmit pulse.

Similarly, of the analog waveform measured on terminal C, a signal corresponding to a rising edge of the first transmit pulse of the analog waveform measured on terminal B is smaller than a signal corresponding to an edge of the second transmit pulse.

A tendency of the signal corresponding to the rising edge of the first transmit pulse becomes more pronounced with increases in fc_hpf as in the case where the number N of pulse waveforms is three. For example, around fc_hpf>0.1f0, the signal corresponding to the rising edge of the first transmit pulse becomes particularly smaller than the signal corresponding to an edge of the second transmit pulse.

Furthermore, of the receive pulses included in the analog waveform measured on terminal C, an output waveform corresponding to the first receive pulse has a small amplitude.

In other words, even if the number N of pulse waveforms is two, as long as it can be determined whether the first receive pulse of the analog waveform measured on terminal C is High or Low, it is possible to determine whether a second receive pulse (second receive pulse waveform) is High or Low, and the transmit pulses can be restored from the receive pulses on the receiving circuitry 300.

In other words, reception performance of the transmitting-receiving circuitry 1000 is determined based on the first receive pulse, which has the smallest amplitude among the receive pulses corresponding to the transmit pulses.

Figure 29:
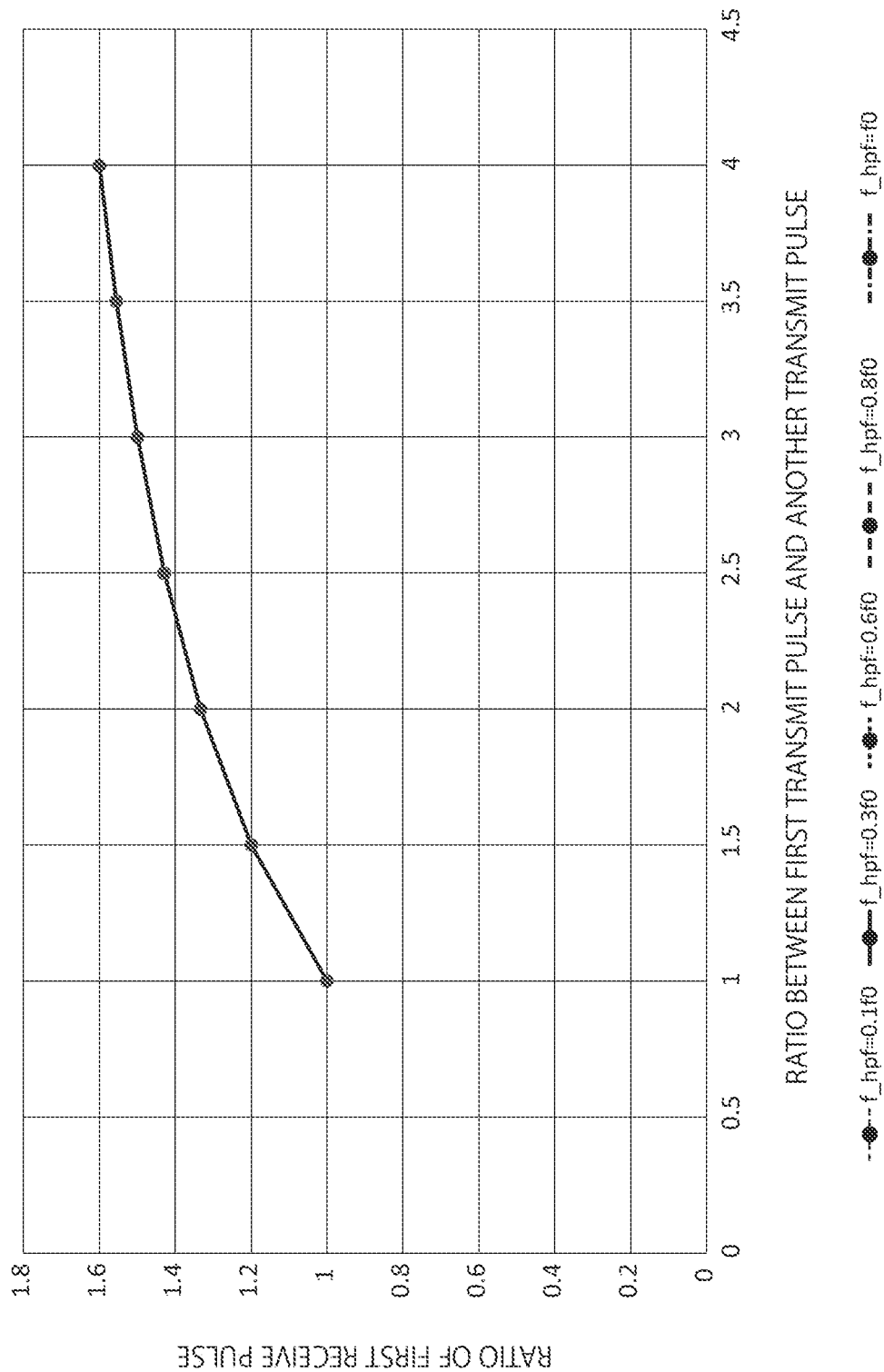
FIG. 29 is a diagram showing a ratio of a first receive pulse to a ratio between a first transmit pulse and a second transmit pulse based on a condition under which power consumption is constant when the power consumption is proportional to pulse amplitude.

FIG. 29 shows a ratio of a first receive pulse to a ratio between a first transmit pulse and a second transmit pulse based on a condition under which power consumption is constant when the power consumption is proportional to pulse amplitude.

Figure 30:
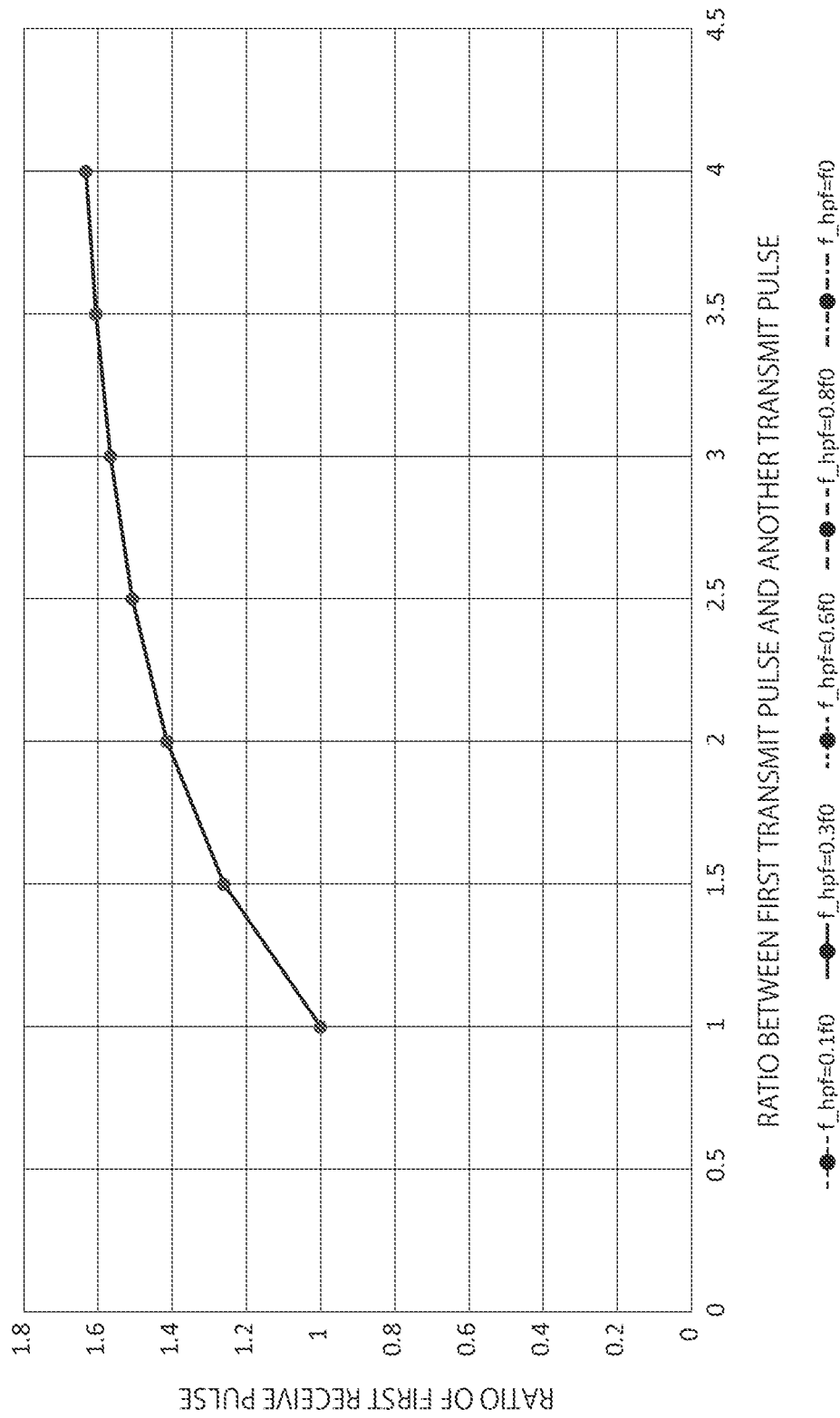
FIG. 30 is a diagram showing a ratio of a first receive pulse to a ratio between a first transmit pulse and a second transmit pulse based on a condition under which power consumption is constant when the power consumption is proportional to the square of pulse amplitude.

FIG. 30 is a diagram showing a ratio of a first receive pulse to a ratio between a first transmit pulse and a second transmit pulse based on a condition under which power consumption is constant when the power consumption is proportional to the square of pulse amplitude.

The smallest pulse amplitude appearing on terminal C, i.e., the second receive pulse, does not vary greatly with fc_hpf of the insulation element 200.

As shown in FIG. 29, with increases in the first transmit pulse of the insulation element 200 over the second transmit pulse, the ratio of the first receive pulse increases. FIG. 29 shows the ratio of the first receive pulse with reference to the first receive pulse when the ratio between the first transmit pulse and the second transmit pulse is 1.

For example, as shown in FIG. 29, if the pulses are transmitted with the first transmit pulse being 1.5 times or more the second transmit pulse, the ratio of the first receive pulse becomes approximately 1.2 times or more. In other words, with increases in the first transmit pulse over the second transmit pulse, the ratio of the first receive pulse increases as well.

Increases in the first receive pulse, which is the smallest, result in improved reception performance.

Regardless of the value of fc_hpf of the insulation element 200, results are the same, and the graphs are shown as being superimposed one on another in FIG. 29.

A similar tendency is exhibited when transmission energy is proportional to the square of pulse amplitude. FIG. 30 also shows the ratio of the first receive pulse with reference to the first receive pulse when the ratio between the first transmit pulse and the second transmit pulse is 1.

For example, as shown in FIG. 30, if the pulses are transmitted with the first transmit pulse being 1.5 times or more the second transmit pulse, the ratio of the first receive pulse becomes approximately 1.2 times or more. In other words, with increases in the first transmit pulse over the second transmit pulse, the ratio of the first receive pulse increases as well.

Increases in the first receive pulse, which is the smallest, result in improved reception performance.

Regardless of the value of fc_hpf of the insulation element 200, results are the same, and the graphs are shown as being superimposed one on another in FIG. 30 as in FIG. 29.

Figure 31:
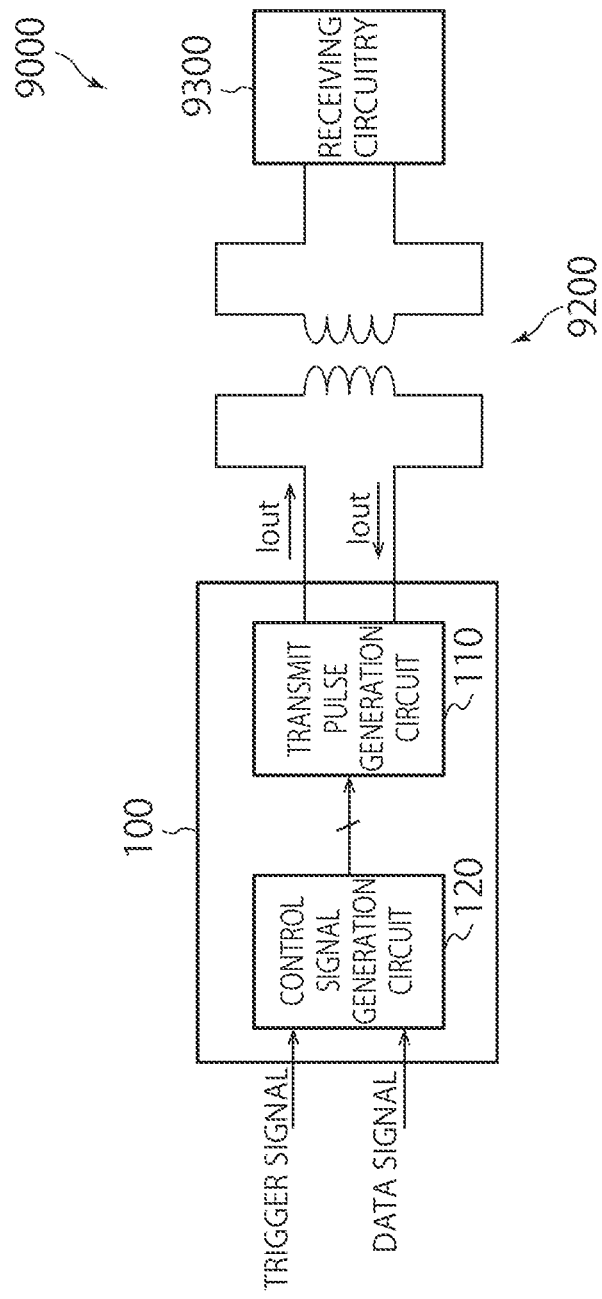
FIG. 31 is a diagram showing an overall configuration of transmitting-receiving circuitry according to a variation.

(Variation 9) FIG. 31 shows an overall configuration of transmitting-receiving circuitry 9000 according to Variation 9.

According to Variation 9, the transmitting-receiving circuitry 9000 includes an insulation element 9200 and receiving circuitry 9300. Except for the insulation element 9200 and the receiving circuitry 9300, a configuration of the transmitting-receiving circuitry 9000 is the same as that of the transmitting-receiving circuitry 1000, and thus description thereof will be omitted.

Using electromagnetic coupling, the insulation element 9200 transfers the analog waveform transmitted from the transmitting circuitry 100.

In so doing, the insulation element 9200 functions as a bypass filter adapted to extract specific frequency bands from a signal transmitted from the transmitting circuitry 100 (bandpass characteristics). As a result, the analog waveform transmitted from the transmitting circuitry 100 changes shape.

Using the characteristics of a high-pass filter, the insulation element 9200 outputs the analog waveform (second waveform) by enhancing a frequency component corresponding to the pulse width. The analog waveform whose frequency component is enhanced by the insulation element 9200 includes a signal such as noise other than the electrical signal to be amplified.

For example, if the transmitting circuitry 100 outputs an analog waveform including two pulses, an analog waveform outputted by the insulation element 9200 includes a first receive pulse based on a first transmit pulse and a second receive pulse based on a second transmit pulse. Besides, the analog waveform outputted by the insulation element 9200 includes a third receive pulse, which is an enhanced pulse waveform produced when the first transmit pulse and the second transmit pulse have their frequency components enhanced by the insulation element 200.

The insulation element 9200 outputs an analog waveform including three pulse waveforms to the receiving circuitry 300. In other words, the insulation element 9200 outputs an analog waveform including pulse waveforms larger in number than the two pulse waveforms included in the analog waveform outputted by the transmitting circuitry 100.

The receiving circuitry 9300 receives the analog waveform outputted by the insulation element 9200 and determines the signal, based on the pulse waveforms included in the analog waveform.

In other words, if the number of the pulse waveforms included in the analog waveform is N, the receiving circuitry 9300 determines the signal based on at least N+1 pulse waveforms.

Variation 9 makes it possible to receive a signal based on an analog waveform including pulse waveforms larger in number than the pulse waveforms included in the analog waveform outputted by the transmitting circuitry 100.

In other words, the transmitting-receiving circuitry 9000 makes it possible to transmit signals at reduced power consumption. The transmitting-receiving circuitry 9000 also allows signals resistant to noise and disturbances to be transmitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. Electronic circuitry comprising:
    a transmit pulse generation circuit configured to generate a plurality of pulse waveforms in response to an input signal; and
    a transmission circuit to output a waveform including the plurality of pulse waveforms,
    wherein the pulse waveforms include a first transmit pulse waveform and a second transmit pulse waveform, the first transmit pulse waveform is the first output generated when the input signal is received, and the second transmit pulse waveform is the next output generated and directly follows the first transmit pulse waveform, and the first transmit pulse waveform is larger in amplitude than the second transmit pulse waveform,
    wherein the transmit pulse generation circuit comprises a plurality of first current sources that include first switches, respectively, and a plurality of second current sources that include second switches, respectively, and
    wherein the transmit pulse generation circuit is configured to generate the pulse waveforms by a combination of outputs from the first current sources and the second current sources based on opening and closing of the first switches and the second switches.

2. The electronic circuitry according to claim 1, wherein magnitude of the amplitude of the first transmit pulse waveform is determined by a number of the second switches opened and closed in the second current sources.

3. The electronic circuitry according to claim 1, wherein the output of the second current source is twice the output of the first current source.

4. The electronic circuitry according to claim 1, further comprising a control signal generation circuit configured to control output of the transmit pulse generation circuit based on a trigger signal that indicates output timing of the pulse waveforms and on a data signal that indicates pulse polarity of the pulse waveforms to be outputted.

5. The electronic circuitry according to claim 4, wherein the data signal is a digital signal having a high level and a low level.

6. The electronic circuitry according to claim 1, wherein the pulse waveforms are current pulses and are outputted based on a differential current or a pseudo differential current.

7. The electronic circuitry according to claim 1, wherein the pulse waveforms are voltage pulses and are outputted based on a differential voltage or a pseudo differential voltage.

8. The electronic circuitry according to claim 1, wherein the transmission circuit outputs the pulse waveforms as a first waveform, which is an analog waveform; and
    the first waveform includes at least two of the pulse waveforms.

9. The electronic circuitry according to claim 1, further comprising an AD converter to convert an analog input signal into a digital input signal, wherein
    the AD converter outputs the digital input signal based on timing of a clock signal; and
    based on the timing of the clock signal, the transmission circuit receives the digital input signal at timing which the output from the AD converter remains unchanged, and transmits the pulse waveforms.

10. The electronic circuitry according to claim 1, wherein the amplitude of the first transmit pulse waveform is three times the amplitude of the second transmit pulse waveform.

11. Electronic circuitry comprising:
    a transmit pulse generation circuit configured to generate a plurality of pulse waveforms in response to an input signal;
    a transmission circuit to output a first waveform including the plurality of pulse waveforms; and
    a transfer circuit to transfer the first waveform using electromagnetic coupling to output a second waveform,
    wherein the pulse waveforms include a first transmit pulse and a second transmit pulse waveform, the first transmit pulse waveform is the first output generated when the input signal is received, and the second transmit pulse waveform is the next output generated and directly follows the first transmit pulse, and the first transmit pulse waveform is larger in amplitude than the second transmit pulse waveform,
    wherein the second waveform includes a first receive pulse waveform based on the first transmit pulse waveform, and a second receive pulse waveform based on the second transmit pulse waveform,
    wherein the transmit pulse generation circuit comprises a plurality of first current sources that include first switches respectively and a plurality of second current sources that include second switches respectively, and
    wherein the transmit pulse generation circuit is configured to generate the pulse waveforms by a combination of outputs from the first current sources and the second current sources based on opening and closing of the first switches and the second switches.

12. The electronic circuitry according to claim 11, wherein the transfer circuit has high-pass filter characteristics.

13. The electronic circuitry according to claim 11, wherein the transfer circuit has low-pass filter characteristics.

14. The electronic circuitry according to claim 11, wherein cut-off frequency on a low-frequency side of the transfer circuit is larger than one tenth an inverse of pulse width of the first waveform.

15. The electronic circuitry according to claim 11, wherein the transfer circuit is an insulation element.

16. The electronic circuitry according to claim 15, wherein the insulation element is an insulator or a condenser.

17. Electronic circuitry comprising:
- a transmit pulse generation circuit configured to generate a plurality of pulse waveforms in response to an input signal;
- a transmission circuit to output a first waveform including the plurality of pulse waveforms;
- a transfer circuit to transfer the first waveform using electromagnetic coupling to output a second waveform; and
- a receiver circuit configured to receive the second waveform,
- wherein the pulse waveforms include a first transmit pulse waveform and a second transmit pulse waveform, the first transmit pulse waveform is the first output generated when the input signal is received, and the second transmit pulse waveform is the next output generated and directly follows the first transmit pulse waveform, and the first transmit pulse waveform is larger in amplitude than the second transmit pulse waveform,
- wherein the second waveform includes a first receive pulse waveform based on the first transmit pulse waveform, and a second receive pulse waveform based on the second transmit pulse waveform,
- wherein the transmit pulse generation circuit comprises a plurality of first current sources that include first switches respectively and a plurality of second current sources that include second switches respectively, and
- the transmit pulse generation circuit is configured to generate the pulse waveforms by a combination of outputs from the first current sources and the second current sources based on opening and closing of the first switches and the second switches.

18. The electronic circuitry according to claim 17, further comprising an AD converter to convert an analog input signal into a digital input signal, wherein:
- the AD converter outputs the digital input signal based on transmission timing of a clock signal,
- based on the clock signal, the transmission circuit receives the digital input signal at timing which the output from the AD converter remains unchanged, and transmits the pulse waveforms.

19. The electronic circuitry according to claim 17, wherein:
- the transfer circuit outputs the second waveform by enhancing a frequency component of the first waveform; and
- the frequency component being enhanced causes the second waveform to contain at least one more pulse waveforms compared to the first waveform.

* * * * *